(12) United States Patent
Hayakawa et al.

(10) Patent No.: US 12,024,420 B2
(45) Date of Patent: Jul. 2, 2024

(54) SENSING DEVICE AND METHOD FOR MANUFACTURING SENSING DEVICE

(71) Applicants: Etsuji Hayakawa, Tokyo (JP); Taketomo Nakane, Tokyo (JP)

(72) Inventors: Etsuji Hayakawa, Tokyo (JP); Taketomo Nakane, Tokyo (JP)

(73) Assignee: MITSUMI ELECTRIC CO., LTD., Tokyo (JP)

( * ) Notice: Subject to any disclaimer, the term of this patent is extended or adjusted under 35 U.S.C. 154(b) by 237 days.

(21) Appl. No.: 17/656,446

(22) Filed: Mar. 25, 2022

(65) Prior Publication Data

US 2022/0315413 A1 Oct. 6, 2022

(30) Foreign Application Priority Data

Mar. 30, 2021 (JP) .................................. 2021-058777

(51) Int. Cl.
*B81B 7/00* (2006.01)
(52) U.S. Cl.
CPC .... *B81B 7/0074* (2013.01); *B81B 2203/0353* (2013.01); *B81B 2207/012* (2013.01);
(Continued)
(58) Field of Classification Search
CPC .......... B81C 1/0023; B81C 2203/0154; B81C 2203/0792; H01L 21/50; H01L 21/561;
(Continued)

(56) References Cited

U.S. PATENT DOCUMENTS

2003/0156743 A1 8/2003 Okada et al.
2012/0000285 A1 1/2012 Waga et al.
(Continued)

FOREIGN PATENT DOCUMENTS

JP 2003-235830 8/2003
JP 2006-023051 1/2006
(Continued)

OTHER PUBLICATIONS

Extended European Search Report mailed on Jul. 12, 2022 with respect to the corresponding European patent application No. 22164575.7.

*Primary Examiner* — Moazzam Hossain
(74) *Attorney, Agent, or Firm* — IPUSA, PLLC

(57) ABSTRACT

A sensing device includes a lead frame, a first insulating film, a semiconductor integrated circuit chip provided over the lead frame via the first insulating film, and a first bonding wire via which an external derivation lead and the semiconductor integrated circuit chip are electrically coupled to each other. The sensing device includes a sensor chip disposed over the semiconductor integrated circuit chip such that a first surface of the sensor chip faces the semiconductor integrated circuit chip. The sensing device includes a sensor provided on a second surface of the sensor chip. The sensing device includes a molding resin with which the lead frame, the semiconductor integrated circuit chip, the sensor chip, and the first bonding wire are sealed. The sensor chip is electrically coupled to the semiconductor integrated circuit chip, and the molding resin has an opening in which the sensor is exposed.

9 Claims, 21 Drawing Sheets

(52) U.S. Cl.
CPC . *B81B 2207/097* (2013.01); *B81C 2203/0154* (2013.01); *B81C 2203/0792* (2013.01)

(58) Field of Classification Search
CPC ....... H01L 2021/60007; H01L 21/4825; H01L 21/565
See application file for complete search history.

(56) References Cited

U.S. PATENT DOCUMENTS

| | | |
|---|---|---|
| 2014/0291829 A1 | 10/2014 | Le Neel et al. |
| 2016/0027992 A1* | 1/2016 | Lo ..................... G01L 19/0069 438/51 |
| 2016/0225809 A1* | 8/2016 | Vittu ..................... H01L 21/568 |
| 2017/0323839 A1 | 11/2017 | Ariki |
| 2020/0158672 A1 | 5/2020 | Nakane |
| 2021/0096033 A1* | 4/2021 | Mori ..................... G01L 1/16 |

FOREIGN PATENT DOCUMENTS

| | | |
|---|---|---|
| JP | 2006-237051 | 9/2006 |
| JP | 2016-018979 | 2/2016 |
| JP | 2020-085498 | 6/2020 |
| WO | 2010/113712 | 10/2010 |

\* cited by examiner

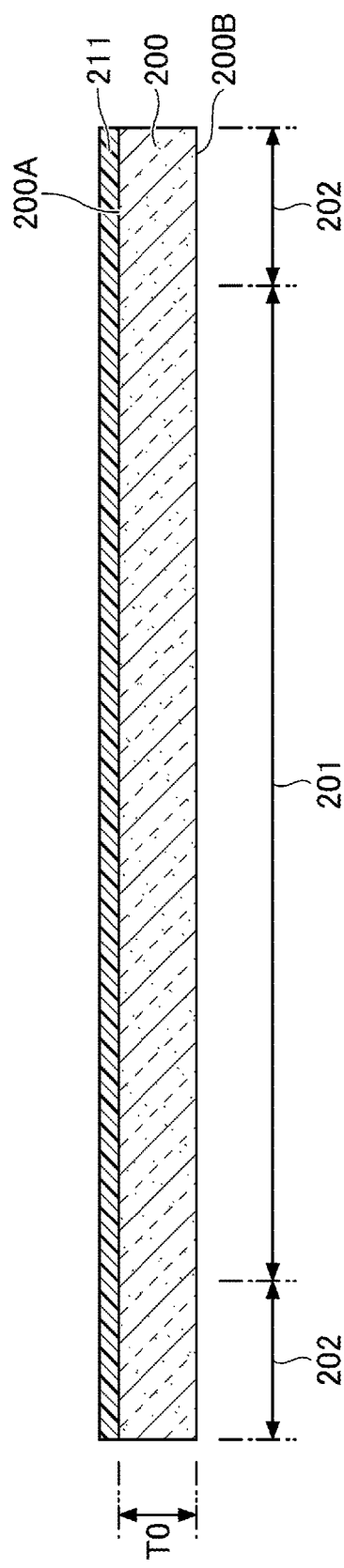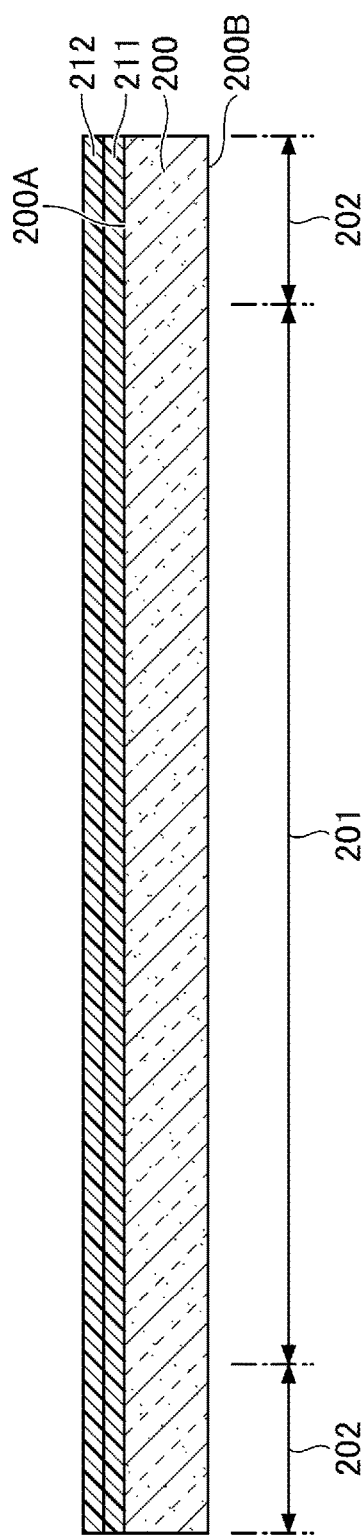

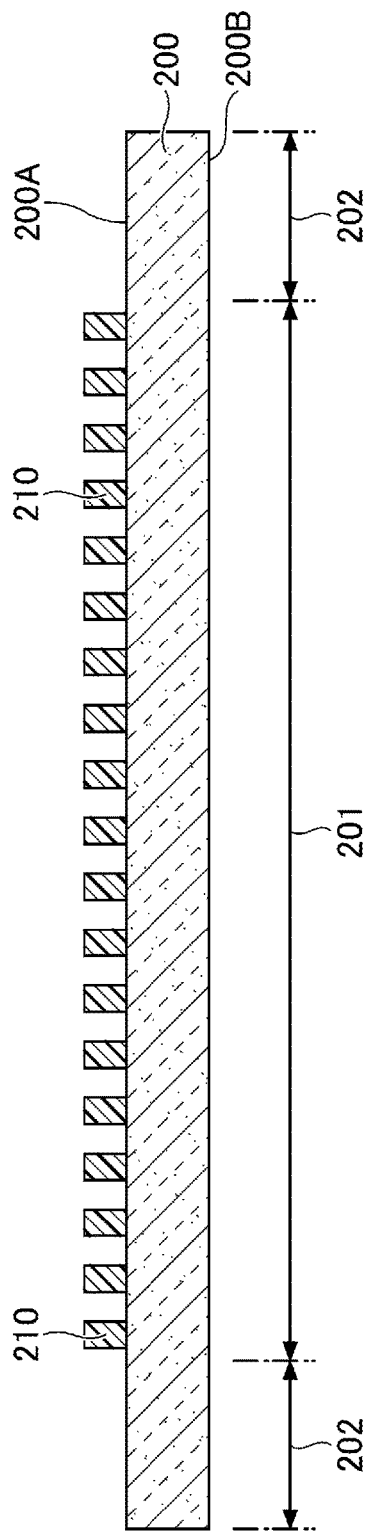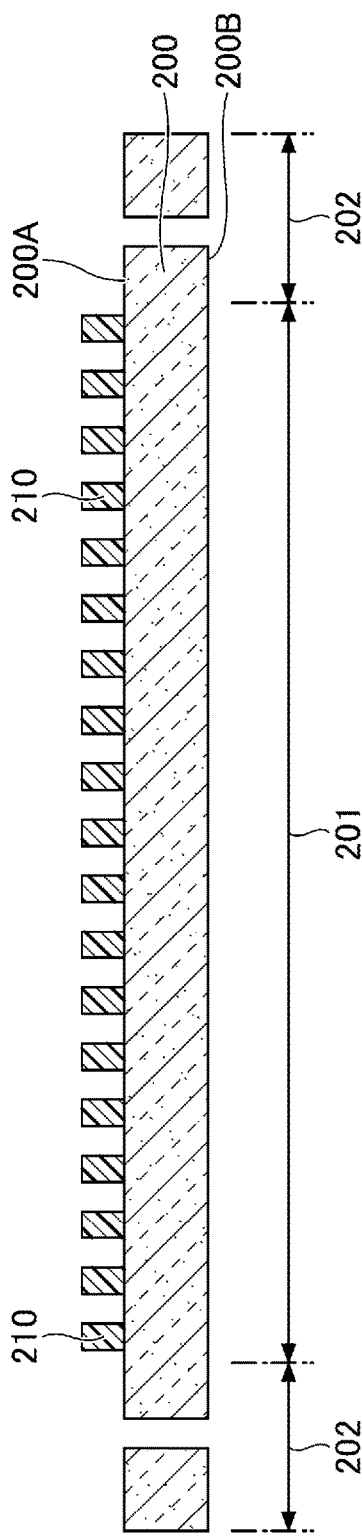

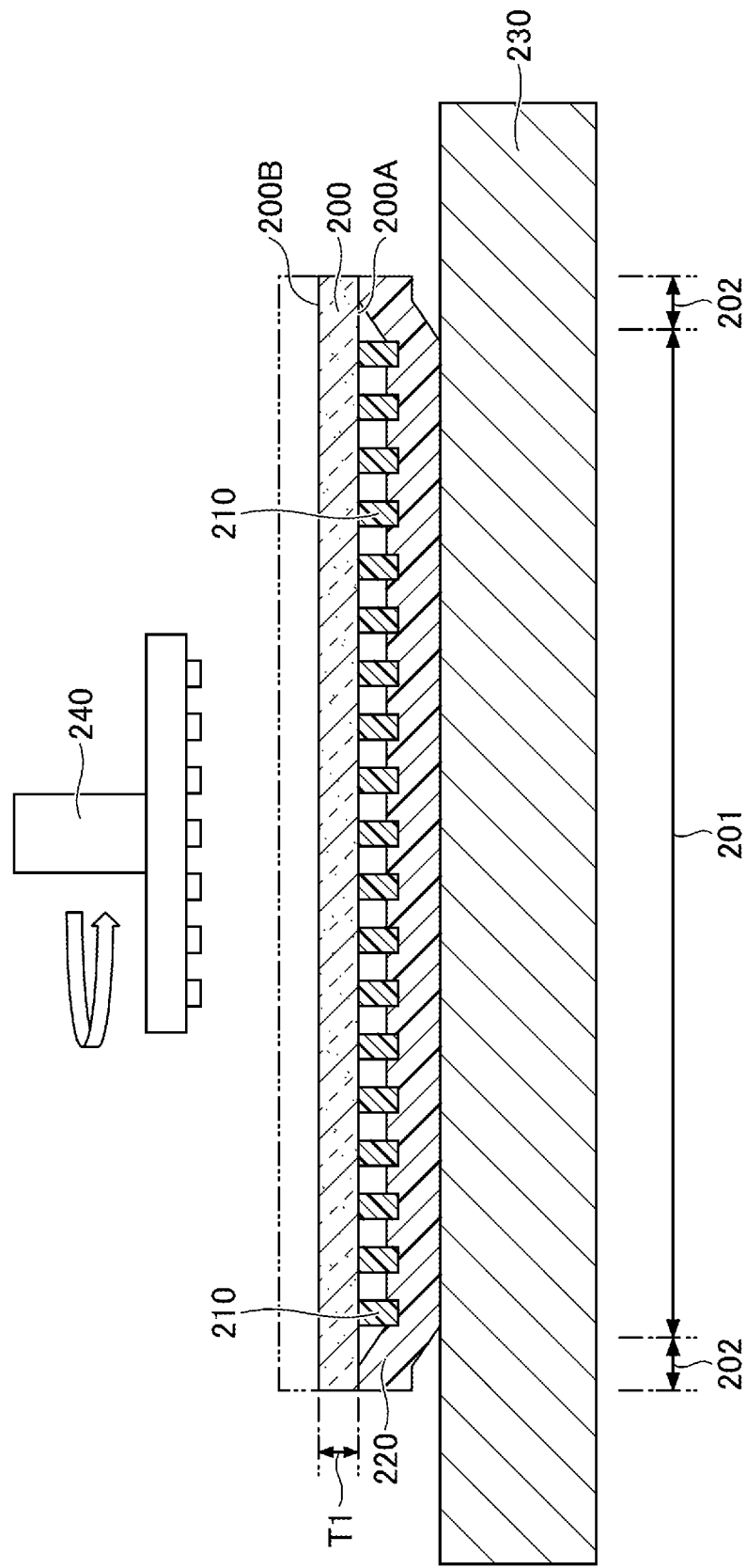

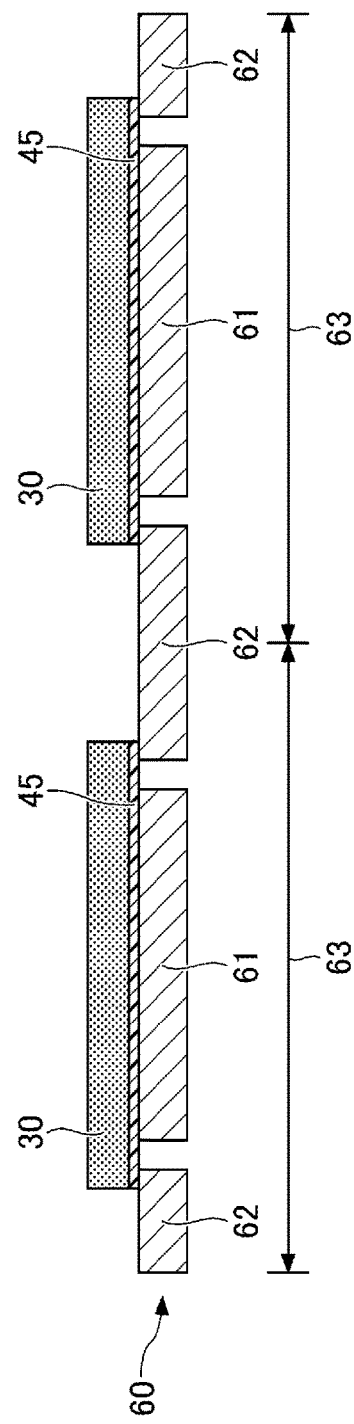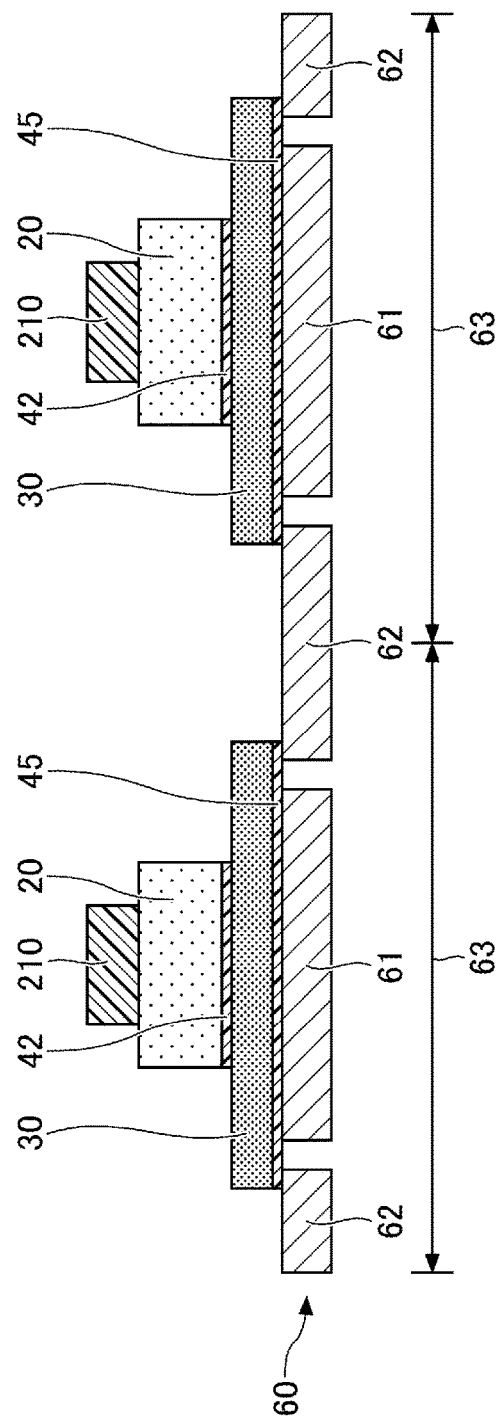

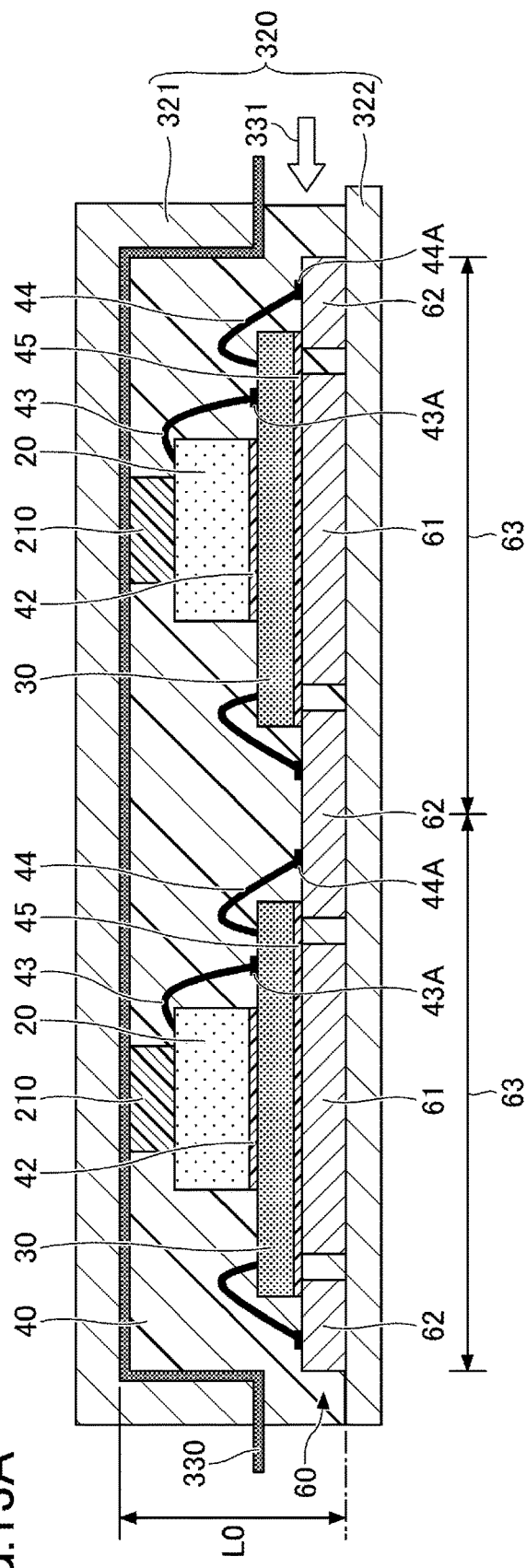
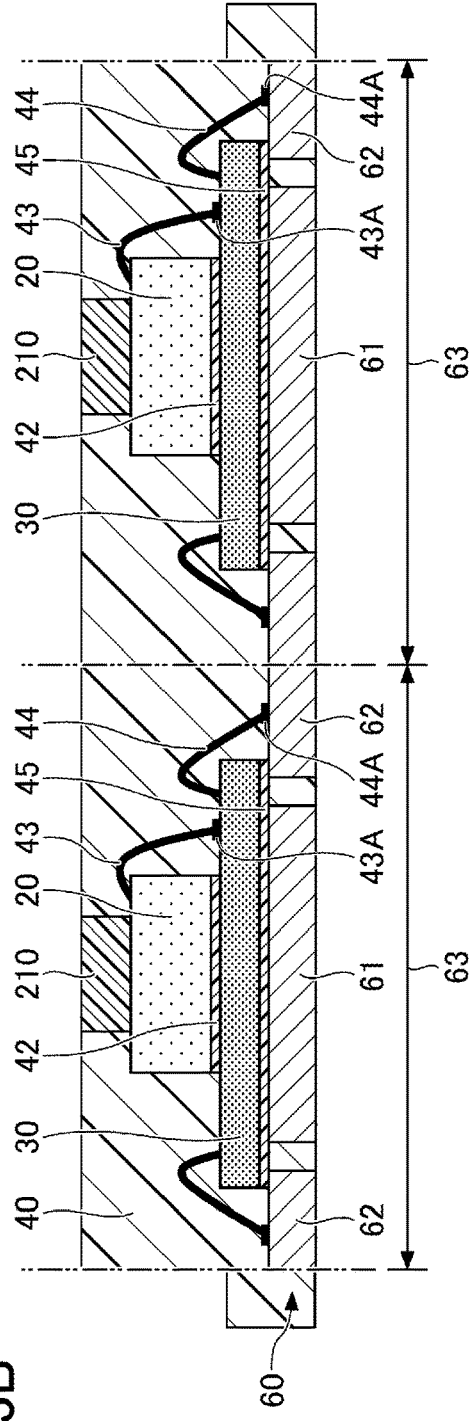
FIG.13A
FIG.13B

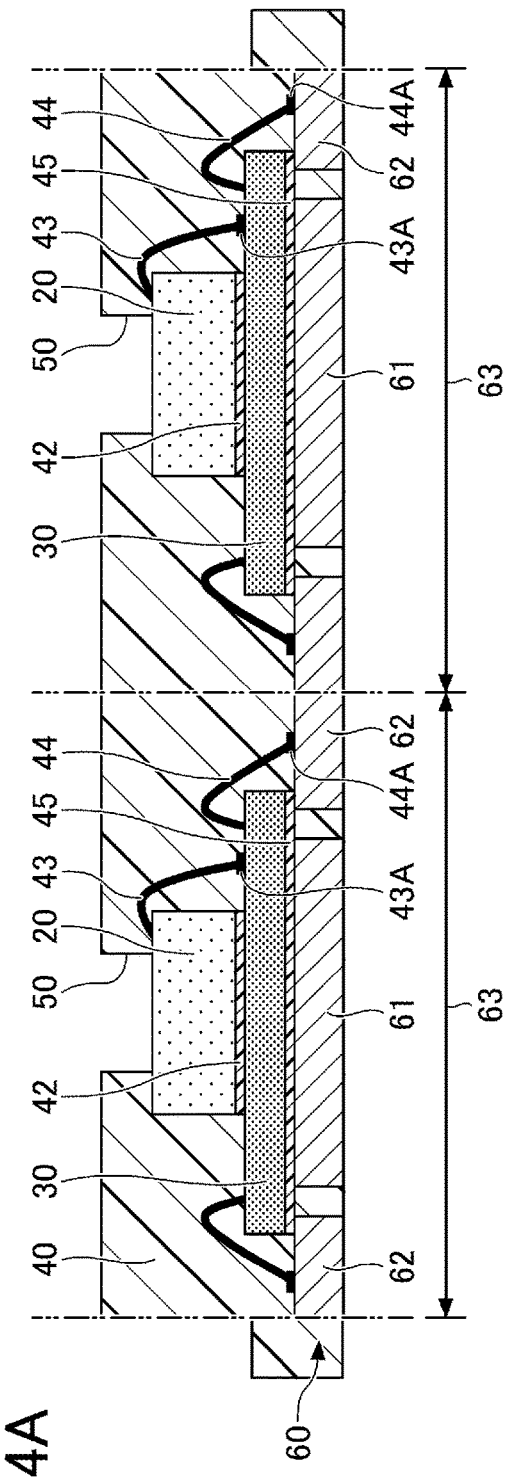
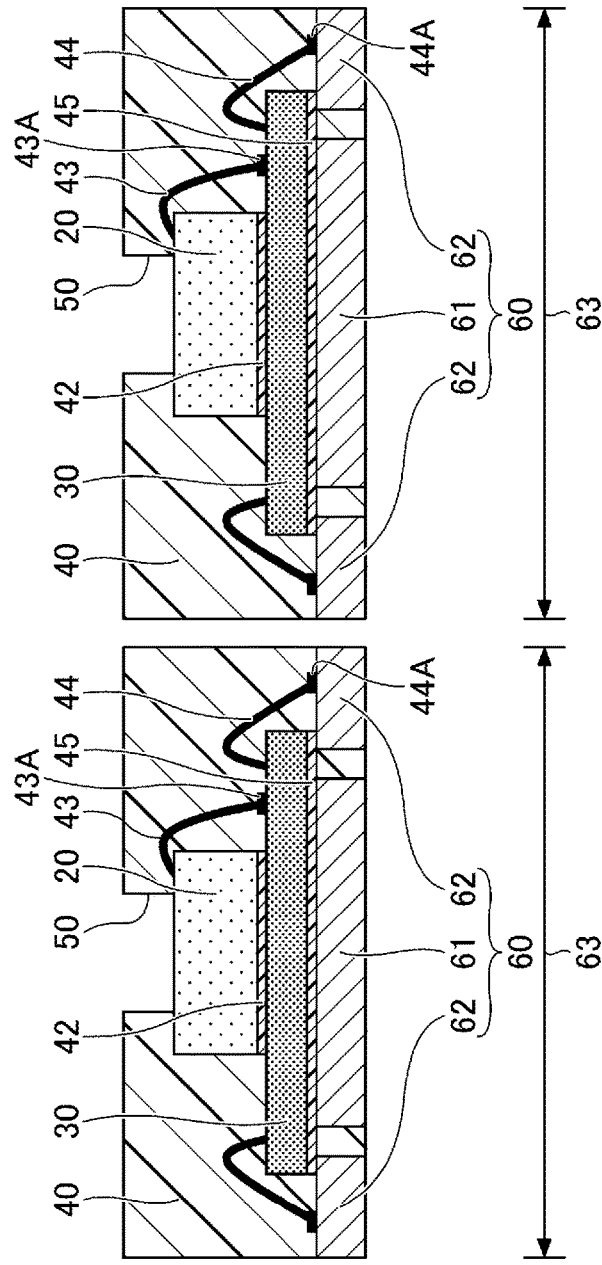
FIG.14A
FIG.14B

SENSING DEVICE AND METHOD FOR MANUFACTURING SENSING DEVICE

CROSS-REFERENCE TO RELATED APPLICATIONS

This application claims priority under 35 U.S.C. § 119 to Japanese Patent Application No. 2021-058777, filed Mar. 30, 2021, the contents of which are incorporated herein by reference in their entirety.

BACKGROUND

1. Field of the Invention

The present disclosure relates to a sensing device and a method for manufacturing the sensing device.

2. Description of the Related Art

In sensing devices such as humidity sensors or temperature sensors, sensor chip surfaces that are sensing surfaces need to be exposed. Some sensing devices are proposed as one-package sensing devices each of which incorporates an application specific integrated circuit (ASIC) chip in order to output a sensing signal by processing the sensing signal. In recent years, in order to make the sensing device more compact, the sensing device has been proposed to have an exposed sensing surface in an opening in a molding resin. In the sensing device, a sensor chip is provided over the ASIC chip, and lead terminals are provided on each side of the ASIC chip. The sensor chip, the lead terminals, and the ASIC chip are sealed with the molding resin.

RELATED-ART DOCUMENT

Patent Document

[Patent Document 1] Japanese Unexamined Patent Application Publication No. 2016-18979
[Patent Document 2] Japanese Unexamined Patent Application Publication No. 2020-85498

In related art, if the sensing device is made compact, the size of each lead terminal that is an external derivation lead is reduced. Likewise, if the size of the ASIC chip within the sensing device is increased, the size of each lead terminal is reduced. If the lead terminal is reduced, a smaller region in which a bonding wire can be connected to the lead terminal is obtained, and thus an adhesive area of the bonding wire is reduced. Therefore, a bonding fault may occur.

Also, in the related art, in order to form the opening on the sensor chip, a protruding portion corresponding to the opening is formed in a mold during molding. However, when the sensor chip is laminated over the ASIC chip, variations in a thickness of each of the sensor chip and the ASIC chip occur. For this reason, if the thickness of a target sensing device is set to a desired thickness, a greater difference between a total thickness of the sensor chip and the ASIC chip and the desired thickness of the target sensing device is obtained, which may result in damage to the sensor chip through the protruding portion of the mold. In contrast, if a smaller difference between the total thickness of the sensor chip and the ASIC chip and the desired thickness of the target sensing device is obtained, the protruding portion of the mold does not contact the sensor chip, and thus the molding resin enters between the protruding portion of the mold and the sensing surface of the sensor chip. Therefore, the sensing surface of the sensor chip may be covered by the molding resin.

SUMMARY

In one aspect of the present disclosure, a sensing device includes a lead frame including an external derivation lead. The sensing device includes a first insulating film, the first insulating film being resilient. The sensing device includes a semiconductor integrated circuit chip provided over the lead frame via the first insulating film. The sensing device includes a first bonding wire via which the external derivation lead and the semiconductor integrated circuit chip are electrically coupled to each other. The sensing device includes a sensor chip having a first surface and a second surface opposite to the first surface, the sensor chip being disposed over the semiconductor integrated circuit chip such that the first surface faces the semiconductor integrated circuit chip. The sensing device includes a sensor provided on the second surface of the sensor chip and a molding resin with which the lead frame, the semiconductor integrated circuit chip, the sensor chip, and the first bonding wire are sealed. The sensor chip is electrically coupled to the semiconductor integrated circuit chip, and the molding resin has an opening in which the sensor is exposed.

In the present disclosure, a larger region of external derivation lead that enables connection to a bonding wire can be secured, while reliably exposing a sensing surface of a sensor chip.

BRIEF DESCRIPTION OF THE DRAWINGS

FIGS. 7A and 7B are cross-sectional views (first part) of an example of the sensor chip according to the first embodiment, the cross-sectional views being described for the method for manufacturing the sensor chip;

FIGS. 8A and 8B are cross-sectional views (second part) of an example of the sensor chip according to the first embodiment, the cross-sectional views being described for the method for manufacturing the sensor chip;

FIG. 10 is a cross-sectional view (fourth part) of an example of the sensor chip according to the first embodiment, the cross-sectional view being described for the method for manufacturing the sensor chip;

FIGS. 11A and 11B are cross-sectional views (first part) of an example of the sensing device according to the first embodiment, the cross-sectional views being described for the method for manufacturing the sensing device;

FIGS. 13A and 13B are cross-sectional views (third part) of an example of the sensing device according to the first embodiment, the cross-sectional views being described for the method for manufacturing the sensing device;

FIGS. 14A and 14B are cross-sectional views (fourth part) of an example of the sensing device according to the first embodiment, the cross-sectional views being described for the method for manufacturing the sensing device;

DESCRIPTION OF THE EMBODIMENTS

An object of one or more embodiments in the present disclosure is to provide a sensing device and a method for manufacturing the sensing device that can secure a larger region of an external derivation lead capable of being coupled to a bonding wire, while reliably exposing a sensing surface of a sensor chip.

One or more embodiments in the present disclosure will be described below in detail with reference to the drawings. In this description and the drawings, functional components each of which has substantially the same configuration are denoted by the same numerals, and description thereof may be omitted.

First Embodiment

Figure 1:
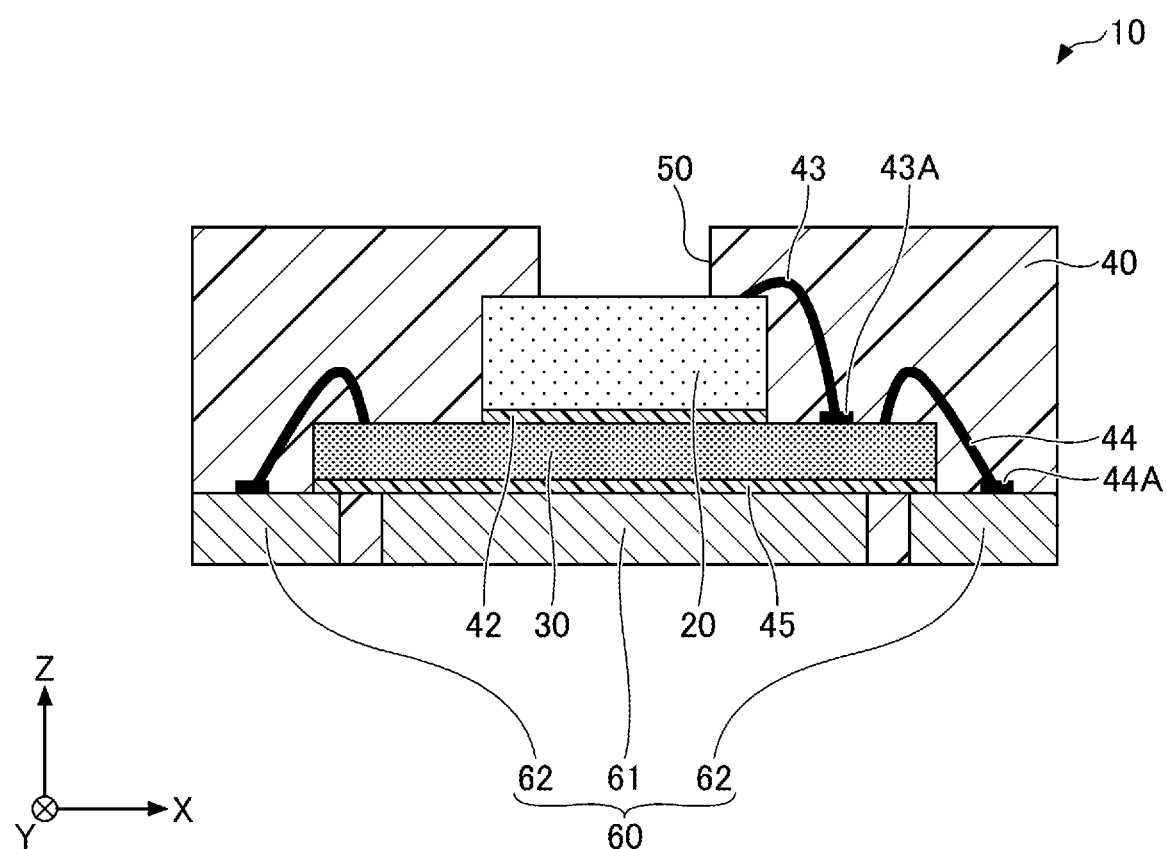
FIG. 1 is a cross-sectional view of an example of the configuration of a sensing device according to a first embodiment.

A first embodiment will be described below. FIG. 1 is a cross-sectional view of an example of the configuration of a sensing device according to the first embodiment.

A plane shape of a sensing device 10 according to the first embodiment is an approximate rectangle in which one pair of opposite sides is parallel to the X-direction and another pair of opposite sides is the Y-direction. The X-direction and Y-direction are perpendicular to each other. The sensing device 10 has a thickness in the Z-direction perpendicular to the X-direction and the Y-direction. The planar shape of the sensing device 10 is not limited to the rectangle, and may be a circle, an ellipse, a polygon, or the like.

The sensing device 10 includes a sensor chip 20 that is a first semiconductor chip, and includes an application specific integrated circuit (ASIC) chip 30 that is a second semiconductor chip. The sensing device 10 also includes a molding resin 40 and a lead frame 60.

The lead frame 60 includes a die pad 61 and a plurality of lead terminals 62. The thickness of the lead frame 60 may be in the range of from 100 µm through 200 µm, for example. The lead terminals 62 are disposed toward two ends of the die pad 61. Each lead terminal 62 is an example of an external derivation lead.

The ASIC chip 30 is laminated over the die pad 61 via a first die attach film (DAF) 45. The ASIC chip 30 is also laminated over an inner end of each lead terminal 62 via the first DAF 45. The sensor chip 20 is laminated over the ASIC chip 30 via a second DAF 42. That is, the sensor chip 20 and the ASIC chip 30 are formed to have a stacked structure in which the sensor chip 20 is laminated over the ASIC chip 30. The sensor chip 20 is provided over the ASIC chip 30 via the second DAF 42 such that the bottom surface of the sensor chip 20 faces the ASIC chip 30. The thickness of the sensor chip 20 may be, for example, in the range of from 200 µm through 400 µm. The thickness of the ASIC chip 30 may be, for example, in the range of from 100 µm through 150 µm. The thickness for each of the first DAF 42 and the second DAF 45 is, for example, in the range of from 10 µm through 30 µm.

For example, a composite elastic modulus of each of the first DAF 45 and the second DAF 42 is in the range of from 1000 MPa through 3000 MPa, at a temperature of 25° C. Also, the composite elastic modulus of each of the first DAF 45 and the second DAF 42 is in the range of from 30 MPa through 50 MPa, at a temperature of 180° C. The composite elastic modulus of each of the first DAF 45 and the second DAF 42 is less than an elastic modulus of each of the ASIC chip 30 and the sensor chip 20. Each of the composite elastic modulus of each of the first DAF 45 and the second DAF 42 is preferably one-tenth or less the elastic modulus of each of the ASIC chip 30 and the sensor chip 20, more preferably one-fiftieth or less the elastic modulus of each of the ASIC chip 30 and the sensor chip 20, and yet more preferably one-hundredth or less the elastic modulus of each of the ASIC chip 30 and the sensor chip 20. Each of the first DAF 45 and the second DAF 42 is compressed in a thickness direction, and thus is elastically deformed. In other words, each of the first DAF 45 and the second DAF 42 has resiliency. The first DAF 45 is an example of a first insulating film, and the second DAF 42 is an example of a second insulating film.

The ASIC chip 30 and the lead terminals 62 are electrically coupled together via a plurality of first bonding wires, respectively. The sensor chip 20 and the ASIC chip 30 are electrically coupled to each other via a plurality of first bonding wires 43. For example, each second bonding wire 43 is bonded, at one end, to a corresponding first pad 35 by ball bonding, and another end is bonded to a corresponding pad 24 by wedge bonding. In this case, each second bonding wire 43 includes a wire bump 43A on the first pad 35. For example, each first bonding wire 44 is bonded, at one end, to a corresponding lead terminal 62 by ball bonding, and another end is bonded to a corresponding second pad 36 by wedge bonding. In this case, each first bonding wire 44 includes a wire bump 44A on the lead terminal 62.

The above laminated sensor chip 20 and ASIC chip 30, as well as the lead frame 60 that includes the plurality of first bonding wires 43 and the plurality of second bonding wires 44, are sealed and packaged with the molding resin 40 as a sealing member. The die pad 61 and the lead terminals 62 are exposed on the bottom surface of the sensing device 10. Also, a portion of the molding resin 40 is between the die pad 61 and each lead terminal 62, and the portion of the molding resin 40 is exposed on the bottom surface of the sensing device 40. The lower surface of the first DAF 45 is covered by the lead frame 60 and the molding resin 40, and thus is not exposed on the bottom surface of the sensing device 10. The thickness of a portion of the molding resin 40 that is higher than the sensor chip 20 can be, for example, in the range of from 50 μm through 500 μm, and preferably in the range of from 100 μm through 250 μm. The height of the upper surface of the molding resin 40 is greater than that of a highest portion of the second bonding wire 43. The thickness of the sensing device 10 may be, for example, in the range of from 500 μm through 1000 μm.

The lead frame 60 is formed of nickel or copper. The first DAF 45 and the second DAF 42 are each formed of an insulating material that is made of a mixture or the like of resin and silica. The molding resin 40 is a light-blocking black resin, such as an epoxy resin containing a mixture or the like of carbon black and silica.

An opening 50 used to expose a portion of the sensor chip 20 in the molding resin 40 is formed on a top side of the sensing device 10. For example, a planar shape of the opening 50 is an approximate rectangle with both pairs of opposite sides, where one pair is parallel to the X-direction and another pair is parallel to the Y-direction. The length of each side of the rectangle is in the range of from 400 μm through 600 μm. A wall surface of the opening 50 is a surface that is approximately perpendicular to the top surface of the sensor chip 20. However, the wall surface of the opening 50 is not required to be perpendicular to the top surface of the sensor chip 20, and can be an inclination surface.

Figure 2:
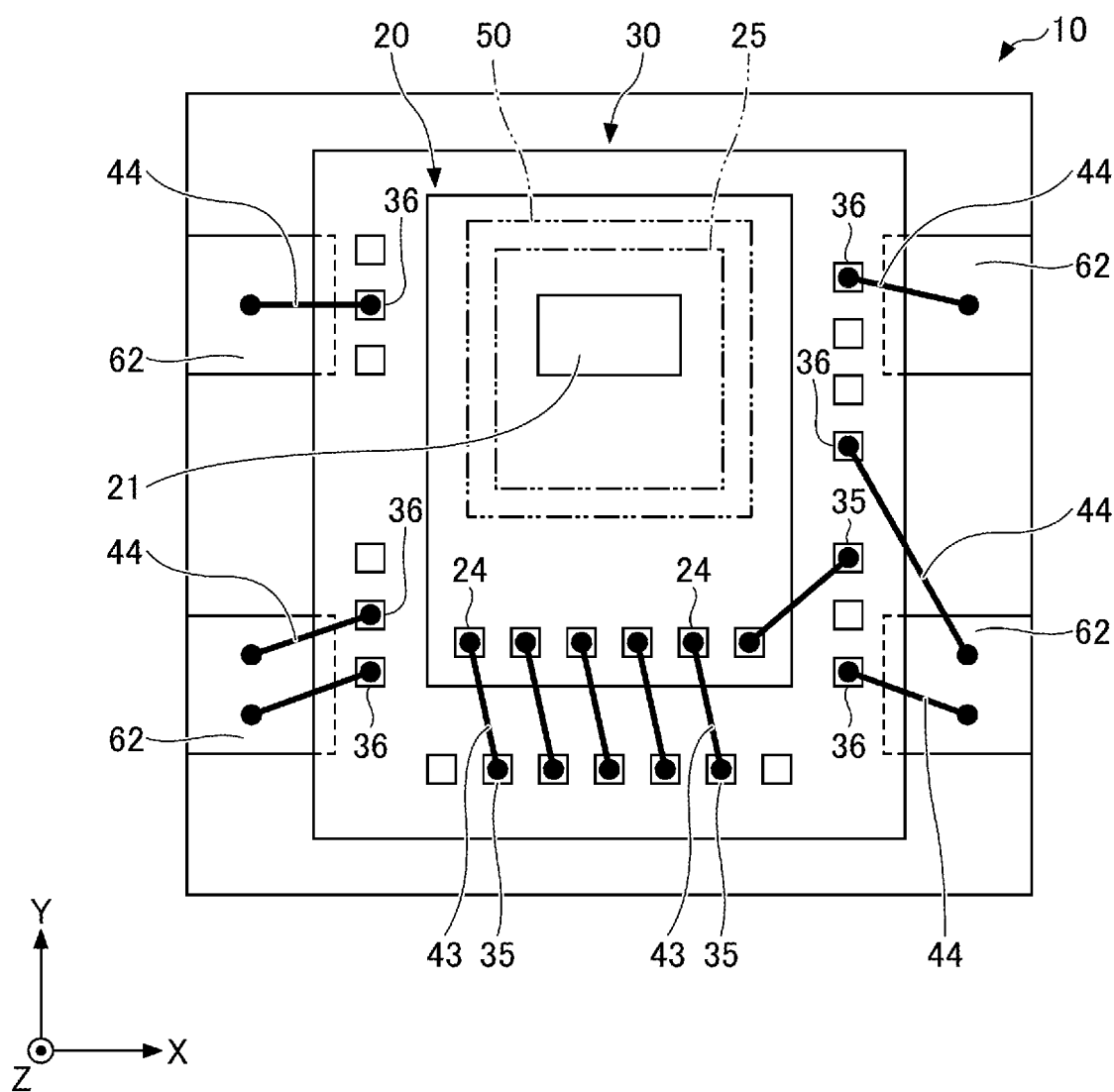
FIG. 2 is a plan view of an example of the sensing device from which a molding resin is removed.

FIG. 2 is a plan view of the sensing device 10 from which the molding resin 40 is removed. As illustrated in FIG. 2, the planar shape of each of the sensor chip 20 and the ASIC chip 30 is an approximate rectangle with both pairs of opposite sides, where one pair is parallel to the X-direction, and another pair is parallel to the Y-direction. The sensor chip 20 is smaller than the ASIC chip 30 and is laminated over the surface of the ASIC chip 30 via the second DAF 42.

A humidity sensor 21, a temperature sensor (not illustrated), and a heater (not illustrated) are provided on a region of the sensor chip 20 that is exposed in the opening 50 on an upper side. The heater is formed below the humidity sensor 21 so as to cover a formation region of the humidity sensor 21. That is, the size of the heater is larger than that of the humidity sensor 21. With this arrangement, the sensor chip 20 and the like are sealed with the molding resin 40 as the sealing member, in a state in which the humidity sensor 21 and the temperature sensor are exposed. The humidity sensor 21 is an example of a sensor. The bottom surface of the sensor chip 20 is an example of a first surface, and the top surface of the sensor chip 20 is an example of a second surface.

A plurality of bonding pads (hereafter may be simply referred to as "pads") 24 are also formed toward one edge of the sensor chip 20. Each pad 24 is formed of, for example, aluminum or an aluminum silicon alloy (AlSi).

The ASIC chip 30 is a semiconductor chip for signal processing and control, and includes, for example, a humidity measurement processor, a temperature measurement processor, a heat controller, and a fault determining unit. The ASIC chip 30 is an example of a semiconductor integrated circuit chip.

A plurality of first pads 35 and a plurality of second pads 36 are provided in a region of the surface of the ASIC chip 30 that is not covered by the sensor chip 20. The first pads 35 and second pads 36 are each formed of, for example, aluminum or an aluminum silicon (AlSi) alloy.

The first pads 35 are coupled to the pads 24 of the sensor chip 20 via the first bonding wires 43, respectively. The second pads 36 are coupled to the lead terminals 62 via the second bonding wires 44, respectively.

During manufacture, a mounted position of the ASIC chip 30 is determined with reference to the lead terminals 62. A mounted position of the ASIC chip 30 over which the sensor chip 20 is mounted is determined with reference to either of the position of the ASIC chip 30 or the lead terminals 62.

The sensing device 10 has a formation permissible region 25 on which the humidity sensor 21 and a temperature sensor are to be disposed on the sensor chip 20. Even when a greatest offset of each of the ASIC chip 30 and the sensor chip 20, from a given mold is obtained during mounting of the sensor chip, the formation permissible region 25 is set within a formation region of a given opening 50, such that the humidity sensor 21 and the temperature sensor are reliably exposed in the given opening. When the humidity sensor 21 and the temperature sensor are formed within the formation permissible region 25, these sensors are reliably exposed in the opening 50, regardless of the above-described offset.

The sensing device 10 according to the first embodiment has the above-described configuration.

In the present embodiment, the ASIC chip 30 is provided over the lead frame 60 via the first DAF 45, and the sensor chip 20 is provided over the ASIC chip 30 via the second DAF 42. In other words, when viewed in a thickness direction of the sensing device 10, each lead terminal 62, the ASIC chip 30, and the sensor chip 20 are disposed at different locations, and further, the first DAF 45 is interposed between the lead frame 60 and the ASIC chip 30. With this arrangement, even when the size of each lead terminal 62 is increased, short-circuiting between the lead terminal 62 and the ASIC chip 30 can be prevented. Thus, a larger region in which each lead terminal 62 can be coupled to the first bonding wire 44 can be secured.

The lower surface of the first DAF 45, which is provided on the bottom surface of the ASIC chip 30, is covered by the lead frame 60 and the molding resin 40, and thus is not exposed on the bottom surface of the sensing device 10. With this arrangement, moisture that enters from the bottom surface of the sensing device 10 into an interior of each of the ASIC chip 30 and the sensor chip 20 is likely to be reduced. Also, the sensor chip 20 is not influenced by moisture that enters from a portion other than the opening 50. Therefore, accuracy in measuring a temperature can be increased.

Figure 3:
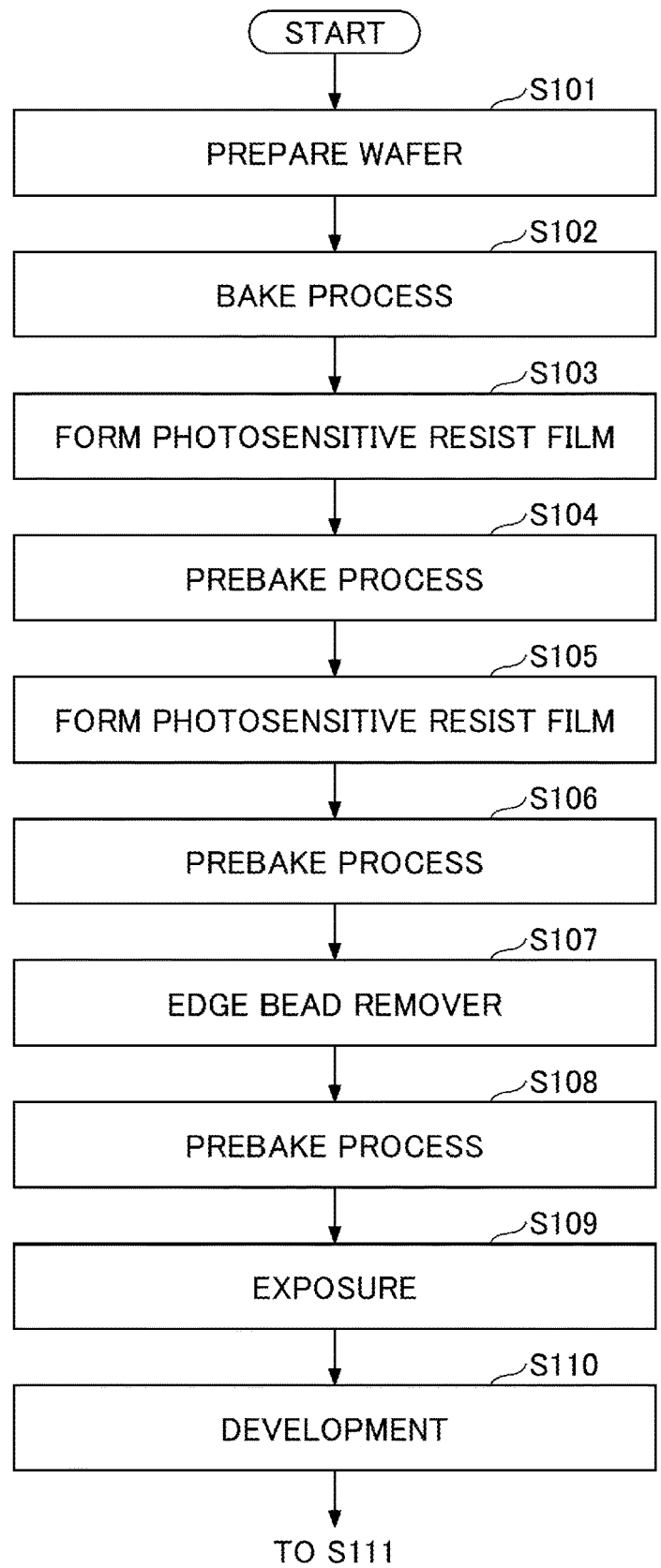
FIG. 3 is a flowchart (first part) illustrating an example of the method for manufacturing a sensor chip according to the first embodiment.
Figure 4:
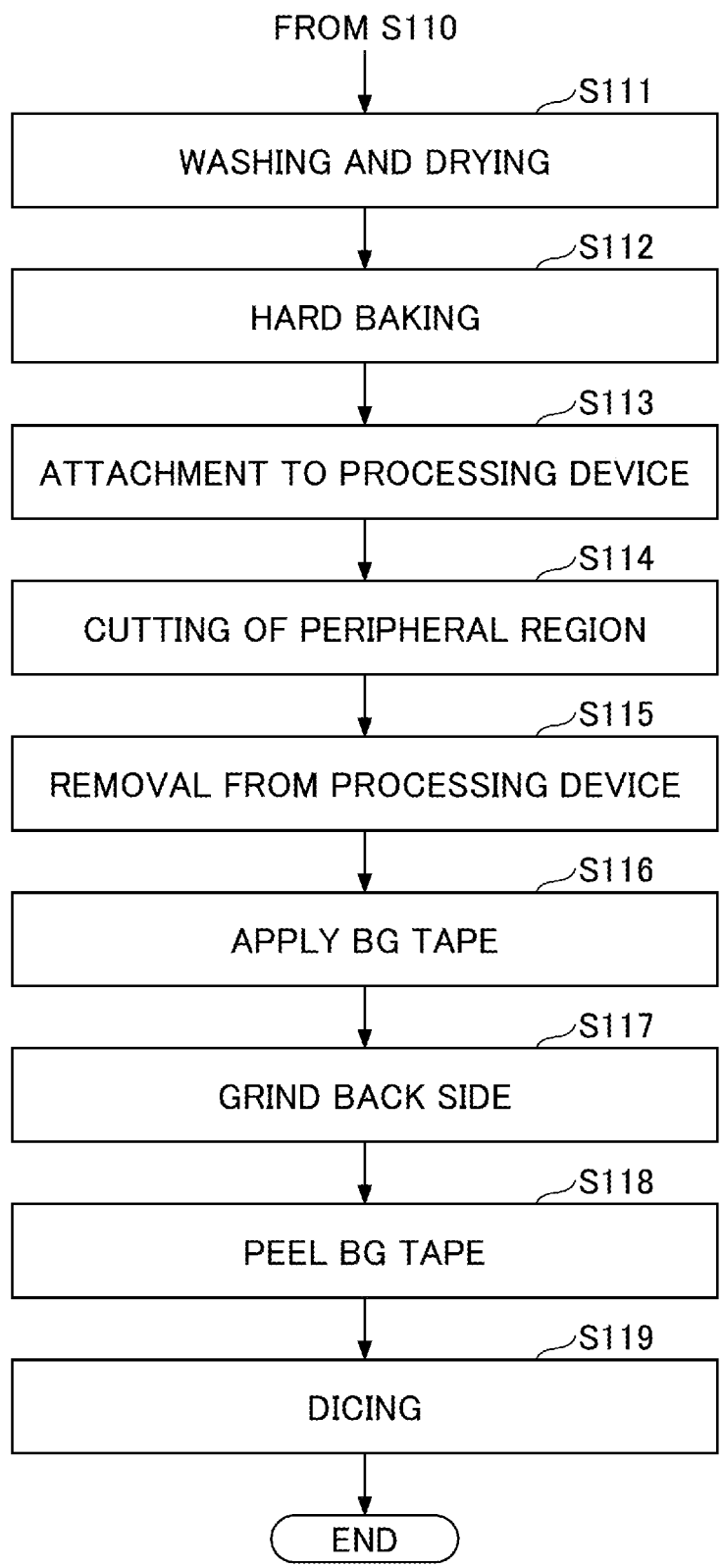
FIG. 4 is a flowchart (second part) illustrating an example of the method for manufacturing the sensor chip according to the first embodiment.

Hereafter, a method for manufacturing the sensing device according to the first embodiment will be described. The process of manufacturing the sensor chip 20 will be described first. FIGS. 3 and 4 are flowcharts illustrating an example of the method for manufacturing the sensor chip 20 according to the first embodiment. FIGS. 5A to 6B are plan views of an example of the sensor chip 20 according to the first embodiment, and the plan views are described for the method for manufacturing the sensor chip 20. FIGS. 7A to 10 are cross-sectional views of an example of the sensor chip 20 according to the first embodiment, and the cross-sectional views are described for the method for manufacturing the sensor chip 20.

Figure 5A:
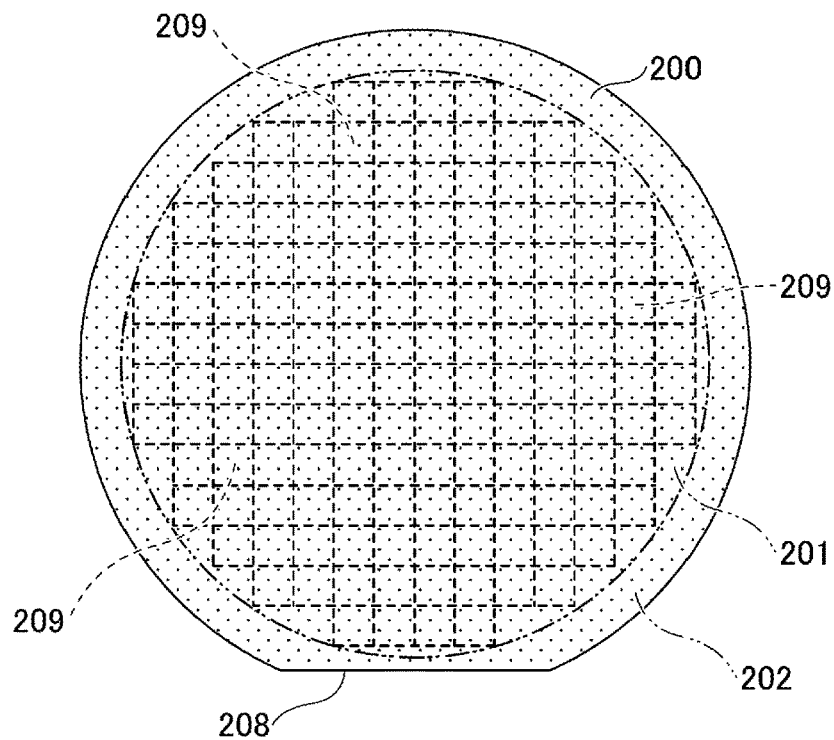
FIGS. 5A and 5B are plan views (first part) of an example of the sensor chip according to the first embodiment, the plan views being described for the method for manufacturing the sensor chip.

As illustrated in FIG. 5A, a wafer 200 having a plurality of chip regions 209 is prepared (step S101). The wafer 200 has a device region 201 in which the chip regions 209 are collected, and has a peripheral region 202 of the device region 201. One sensor chip 20 is obtained for a corresponding single chip region 209. On one surface (top surface 200A) of the wafer 200, each chip region 209 includes a humidity sensor 21, a temperature sensor, a heater, electrodes, lines, and the like. An orientation flat 208 is formed in the wafer 200. A thickness TO of the wafer 200 is greater than the thickness of the sensor chip 20, and is in the range of from 550 µm through 650 µm, for example. The diameter of the wafer 200 is, for example, 6 inches (15.24 cm). Each chip region 209 has an approximately rectangular planar shape with both pairs of opposite sides, where one pair is parallel to the X-direction, and another pair is parallel to the Y-direction. For example, the length for each side of the one pair that is parallel to the X-direction is in the range of from 900 µm through 1100 µm. Also, the length for each side of the another pair that is parallel to the Y-direction is in the range of from 600 µm through 800 µm. The material of the wafer 200 includes, for example, silicon (Si), silicon carbide (SiC), aluminum nitride (AlN), alumina ($Al_2O_3$), gallium nitride (GaN), gallium arsenide (GaAs), or the like.

Then, baking is performed in order to remove moisture contained in the wafer 200 (step S102). For example, a baking temperature is in the range of from 100° C. through 150° C., and the baking time is applied for 1 minute to 3 minutes.

Then, the process of forming protective layers, which are to be sacrificial layers, is performed, where the protective layers are respectively formed at locations at which openings 50 are to be formed. In this case, as illustrated in FIG. 7A, a photosensitive resist film 211, with which the protective layers are to be formed on the surface 200A of the wafer 200, is formed by spin coating (step S103). The photosensitive resist film 211 is formed by rotating the wafer at a rotation speed in the range of from 300 rpm through 600 rpm, for example. The thickness of the photosensitive resist film 211 is, for example, in the range of from 50 µm through 100 µm. After the photosensitive resist film 211 is formed, an edge rinse of the wafer 200 is performed. If a larger amount of the photosensitive resist film 211 that is moved to the back side of the wafer 200 is obtained, a back rinse may be also performed as necessary.

Then, a prebake of the photosensitive resist film 211 is performed (step S104). For example, a prebake temperature is 100° C. through 150° C., and a prebake time is applied for 5 minutes to 10 minutes. With use of the prebake, solvents contained in the photosensitive resist film 211 are removed.

In the present embodiment, in order to perform wire bonding around the opening 50 that is within a region of the sensor chip 20 to be formed in a subsequent process, a resin thickness needs to exceed a given wire height. Also, the height of the opening 50 needs to have a height that is similar to the resin thickness. However, it is difficult to set an appropriate height of the photosensitive resist film, with a single application. For this reason, as illustrated in FIG. 7B, the photosensitive resist film 212 is formed on the photosensitive resist film 211 by spin coating that is performed again (step S105). The photosensitive resist film 212 is formed by rotating the wafer at rotation speed ranging from 300 rpm through 600 rpm, for example. The thickness of the photosensitive resist film 212 is, for example, in the range of from 50 µm through 100 µm. When the thickness of the photosensitive resist film 211 and the thickness of the photosensitive resist film 212 are summed, a total sum of thicknesses of the photosensitive resist films 211 and 212 becomes, for example, greater than or equal to 100 µm and less than or equal to 200 µm. After the photosensitive resist film 212 is formed, the edge rinse of the wafer 200 is performed.

Then, the prebake of the photosensitive resist film 212 is performed (step S106). For example, a prebake temperature is in the range of from 100° C. through 150° C., and the prebake time is applied for 5 minutes to 10 minutes. With use of the prebake, the solvent contained in the photosensitive resist film 212 is removed.

Then, the edge rinse of the wafer 200 is performed (step S107). After the prebake in step S106, the edge rinse is performed, because an edge resist can be removed in a state in which there is no resist that is moved from the wafer center.

Then, the prebake of the wafer 200 is performed (step S108). For example, the prebake temperature is in the range of from 100° C. through 150° C. The prebake time may be approximately applied for 1 minute to 2 minutes for purposes of removing the rinse.

Then, the photosensitive resist films 211 and 212 are exposed (step S109). The exposure is performed so as to correspond to each opening 50 to be formed on the sensor chip 20. That is, the exposure is performed with respect to a region of the top surface of the sensor chip 20 where the humidity sensor 21 and the temperature sensor are provided. For example, an i-ray, a g-ray, or an h-ray can be used for the exposure, and the ray energy is in the range of from 500 mJ through 550 mJ.

Figure 5B:
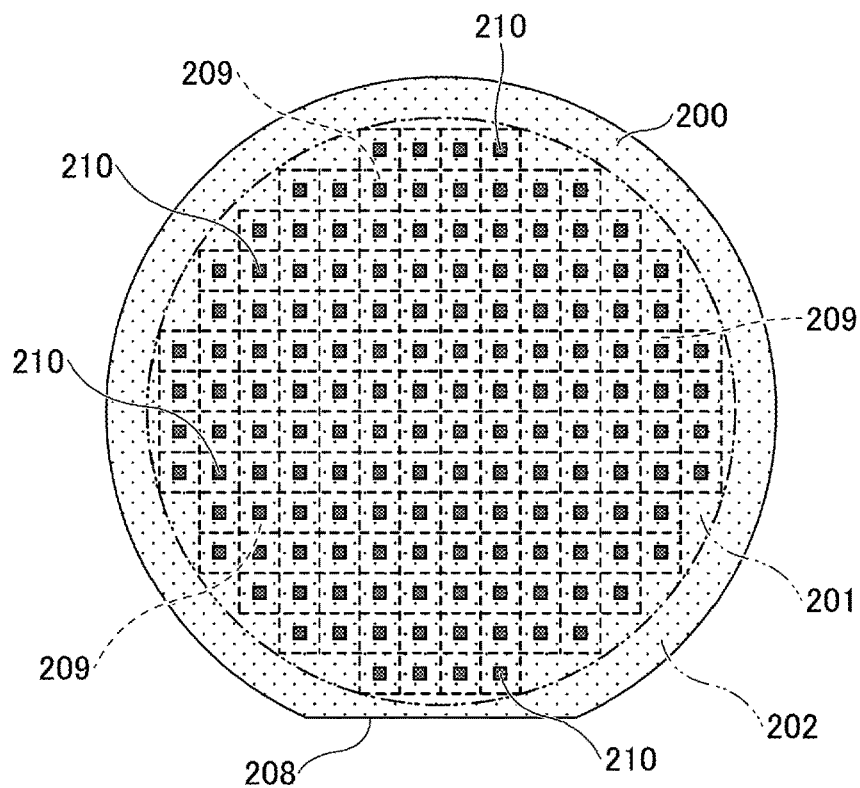

Then, the photosensitive resist films 211 and 212 are developed (step S110). As a result, as illustrated in FIG. 5B and FIG. 8A, the protective layer 210 of the photosensitive resist is formed on each chip region 209. The protective layer 210 covers the humidity sensor 21 and the temperature sensor. For example, the protective layer 210 has a squarely planar shape, and the length of each side of the squarely planar shape is in the range of from 400 µm through 600 µm. The height of the protective layer 210 may be in the range of from 100 µm through 200 µm in the above mentioned process, but may be appropriately set in the range of from 50 µm through 500 µm, for example.

In the present embodiment, as the material of the protective layer 210, a material, such as a novolac-based resin, an acrylic-based resin, or a polyimide-based resin, is used, and the material has a characteristic in which a higher temperature causes softening and deforming of the material. A composite elastic modulus of the protective layer 210 is in the range of from 4000 MPa through 6000 MPa, at a temperature of 25° C. During molding applied at a temperature of 160° C. through 200° C., the composite elastic modulus of the protective layer 210 is in the range of from 1 MPa through 10 MPa. Such a composite elastic modulus of the protective layer 210 is less than the elastic modulus of each of the ASIC chip 30 and the sensor chip 20, and thus a difference in the elastic modulus between the chips can be reduced. The elastic modulus of the protective layer 210 is preferably one-tenth or less the elastic modulus of each of the ASIC chip 30 and the sensor chip 20, more preferably one-fiftieth or less the elastic modulus of each of the ASIC chip 30 and the sensor chip 20, and yet more preferably one-hundredth or less the elastic modulus of each of the ASIC chip 30 and the sensor chip 20.

The thickness of each of the photosensitive films 211 and 212 is set such that a total thickness of the lead frame 60, the first DAF 45, the ASIC chip 30, the second DAF 42, the sensor chip 20, and the protective layer 210 is greater than a distance L0 between the upper surface of a lower mold 322 and the lower surface of an upper mold 321, as described below.

The wafer 200 is then washed and dried (step S111). For washing, for example, pure water is used. For example, a spin dryer is used for drying. For example, the rotation speed is in the range of from 800 rpm through 1200 rpm, and processing time is in the range of from 8 minutes through 12 minutes.

Then, hard baking of the wafer 200 is performed (step S112). For example, a hard baking temperature is in the range of from 150° C. through 200° C., and a hard baking time is applied for 15 minutes to 25 minutes. With use of the hard baking, moisture remaining in the wafer 200, as well as solvents remaining in the protective layers 210, can be removed.

In such a manner, the wafer 200 in which the protective layers 210 are provided on the surface 200A is obtained. The protective layers 210 are formed on the device region 201.

Then, a dicing tape is applied to another surface (back side 200B) of the wafer 200 and the wafer 200 is attached to a processing device (step S113). For example, a dicing machine specified by "DFD6361" by Disco Corporation can be used as the processing device.

Figure 6A:
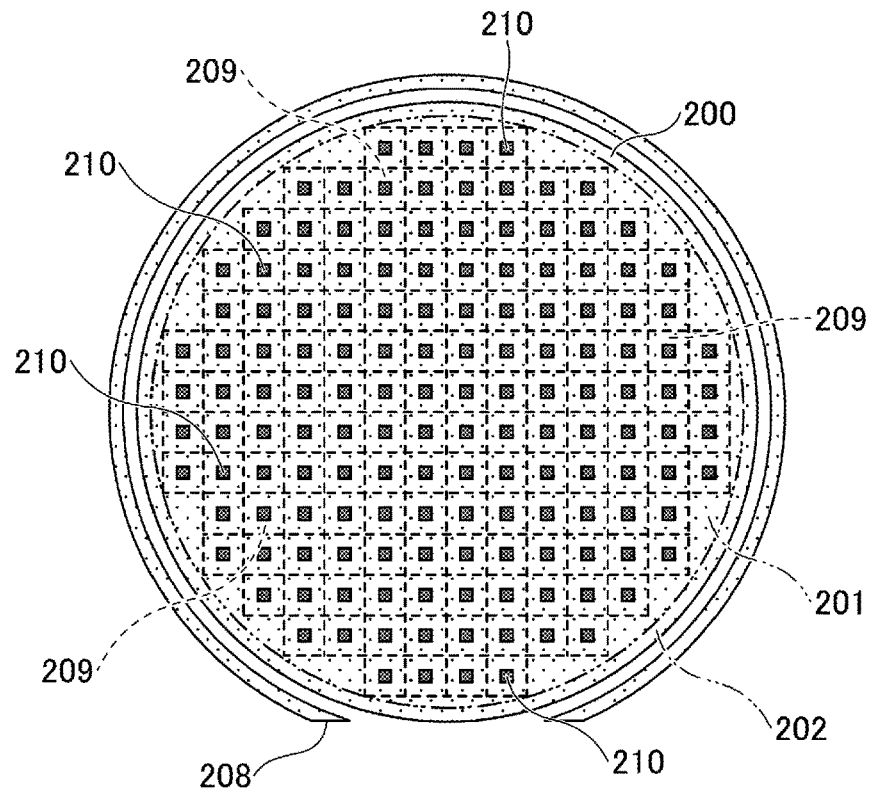
FIGS. 6A and 6B are plan views (second part) of an example of the sensor chip according to the first embodiment, the plan views being described for the method for manufacturing the sensor chip.

Then, as illustrated in FIG. 6A and FIG. 8B, the peripheral region 202 of the wafer 200 is cut such that a cutout has an annular shape (step S114). As a result, the peripheral region 202 is cut along a circle of which the radius is smaller than a radius of the wafer 200 to be separated into two regions. A separated outer region is removed. In the cutting, an edge tangent of the wafer 200 obtained after the cutting may correspond to the orientation flat 208. That is, the edge of the wafer 200 obtained after the cutting may be positioned at the orientation flat 208. The edge of the wafer 200 obtained after the cutting may be also located closer to the center of the wafer 200 than the orientation flat 208.

Figure 6B:
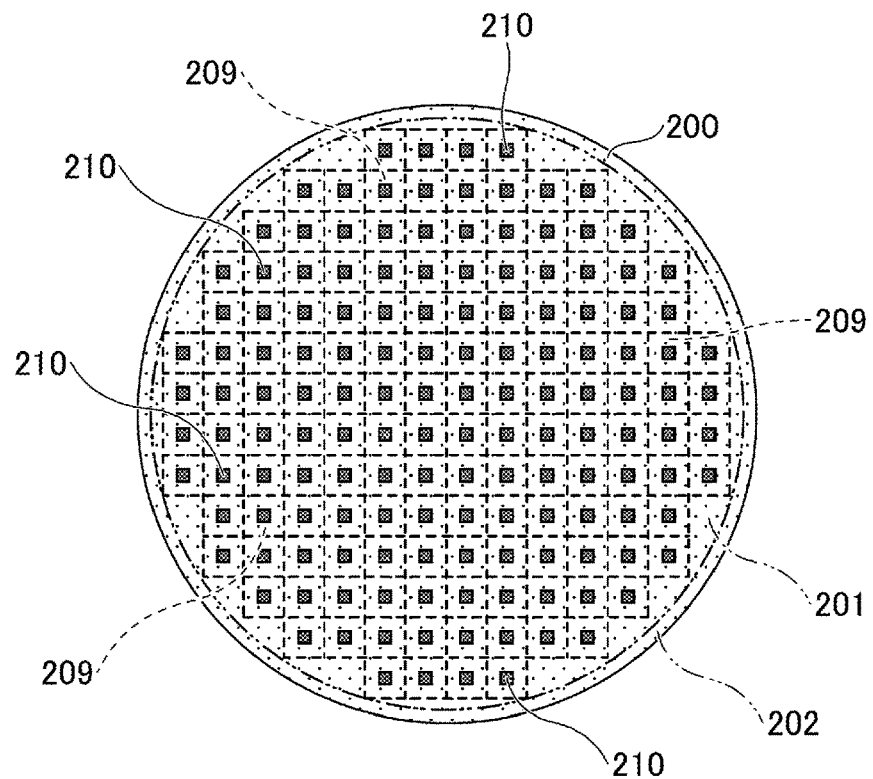
Figure 9:
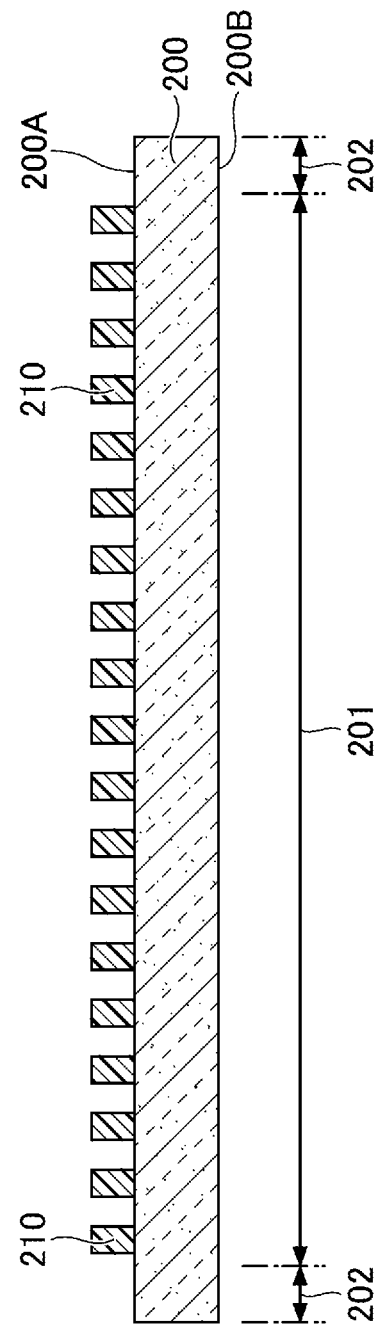
FIG. 9 is a cross-sectional view (third part) of an example of the sensor chip according to the first embodiment, the cross-sectional view being described for the method for manufacturing the sensor chip.

Then, a dicing tape is irradiated with ultraviolet light so that adhesion of the dicing tape is reduced, and then the wafer 200 is removed from the processing device (step S115). As a result, the wafer 200 from which a portion of the peripheral region 202 is removed is obtained, as illustrated in FIG. 6B and FIG. 9.

Then, a BG tape 220 is applied to the surface 200A of the wafer 200 so as to overlap exposed ends of the protective layers 210, and thus the protective layers 210 are covered by the BG tape 220 (step S116). In this case, the BG tape 220 contacts the peripheral region 202 over the entire perimeter of the wafer 200. If a space between the BG tape 220 and the peripheral region 202 is provided, water for cutting may enter the surface 200A of the wafer 200 during back grinding. The BG tape 220 is an example of a protective layer.

Then, as illustrated in FIG. 10, the front of the BG tape 220 is directed to the stage 230, and the wafer 200 is secured to the stage 230. Then, the back side 200B of the wafer 200 is grinded using a grinder 240 (step S117). The back grinding is performed while the grinder 240 is pressed against the wafer 200. The thickness T1 of the wafer that is obtained after the back grinding is approximately the same as that of the sensor chip 20, and is in the range of from 200 μm through 400 μm, for example.

In step S114, the portion of the peripheral region 202 is removed, and thus in the back grinding in step S117, deflection of the wafer 200 is mitigated. In such a manner, the in-plane wafer uniformity of pressure that acts on the wafer 200 through the grinder 240 is approximately obtained. Therefore, the in-plane wafer uniformity of the thickness for the wafer 200 that is obtained after the back grinding of the back side 200B is increased excellently.

Then, the BG tape 220 is irradiated with ultraviolet light so that adhesion of the BG tape 220 is reduced, and then the BG tape 220 is removed from the wafer 200 (step S118).

Then, the wafer 200 is diced to be separated into a plurality of chip regions 209 (step S119).

In such a manner, sensor chips 20 including multiple protective layers 210 are manufactured.

Hereafter, the process of manufacturing the sensing device 10 by using both the sensor chip 20 with the protective layer 210 and the ASIC chip 30 will be described. FIGS. 11 to 14B are cross-sectional views of the sensing device 10, and the cross-sectional views are described for the method for manufacturing the sensing device 10 according to the first embodiment.

As illustrated in FIG. 11A, the lead frame 60 with the die pad 61 and lead terminals 62 is prepared. The lead frame 60 includes a plurality of chip-mounting regions 63, and the die pad 61 and lead terminals 62 are provided for each chip-mounting region 63. Then, for each chip-mounting region 63, the ASIC chip 30 is fixed over the die pad 61 and an inner edge of each lead terminal 62, via the second DAF 45. In practice, although a greater number of chip-mounting regions 63 are provided on the lead frame 60, and thus a greater number of ASIC chips 30 are secured to the die pad 61, only two sensor chips 20 are illustrated in FIG. 11A for the sake of explanation. Each ASIC chip 30 is manufactured to be separate from the sensor chips 20. For example, the first DAF 45 is attached to the bottom surface of the ASIC chip 30, and then another surface of the first DAF 45 is adhered to the die pad 61 and the inner edge of each lead terminal 62.

Then, as illustrated in FIG. 11B, the sensor chip 20 with the protective layer 210, which covers the humidity sensor 21 and the temperature sensor, is secured to the surface of each ASIC chip 30 via the second DAF 42. In this case, for each chip-mounting region 63, the sensor chip 20 with the protective layer 20 is provided over the ASIC chip 30 via the second DAF 42, such that the bottom surface of the sensor chip 20 faces the ASIC chip 30. For example, the second DAF 42 is attached to the bottom surface of the sensor chip 20, and then another surface of the second DAF 42 is adhered to the ASIC chip 30. Subsequently, the first DAF 45 and the second DAF 42 are heated by using an oven or the like to thereby be hardened.

Figure 12A:
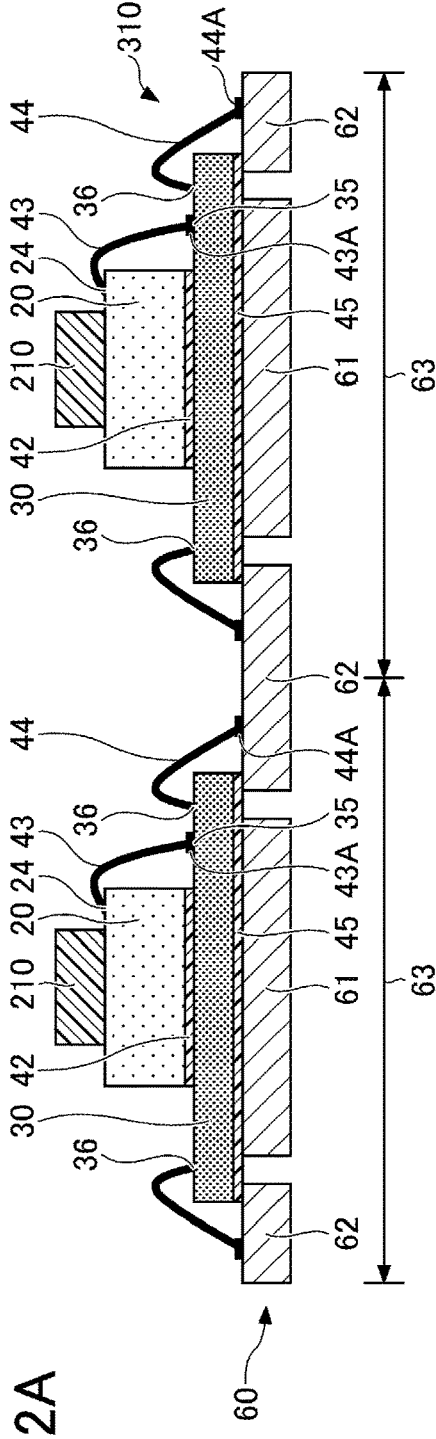
FIGS. 12A and 12B are cross-sectional views (second part) of an example of the sensing device according to the first embodiment, the cross-sectional views being described for the method for manufacturing the sensing device.

Then, as illustrated in FIG. 12A, for each chip-mounting region 63, second pads 36 on each ASIC chip 30 are coupled to lead terminals 62 via second bonding wires 44, respectively. Also, pads 24 on each sensor chip 20 are coupled to first pads 35 on a given ASIC chip 30 via first bonding wires 43, respectively. For example, each first bonding wire 44 is bonded, at one end, to a corresponding lead terminal by ball bonding, and then another end is bonded to a corresponding second pad 36 by wedge bonding. The wire bump 44A of the first bonding wire 44 is formed on the corresponding lead terminal 62. Also, for example, each second bonding wire 43 is bonded, at one end, to a corresponding first pad 35 by ball bonding, and then another end is bonded to a corresponding pad 24 by wedge bonding. The wire bump 43A of the second bonding wire 43 is formed on the corresponding first pad 35. By wire bonding that is performed in such an order, a lower height of a highest portion of each first bonding wire 44 can be obtained with reference to the top surface of the sensor chip 20. Also, a lower height of a highest portion of each second bonding wire 43 can be obtained with reference to the top surface of the sensor chip 20. In the following description, the object illustrated in FIG. 12A may be referred to as a target article 310 to be molded.

Figure 12B:
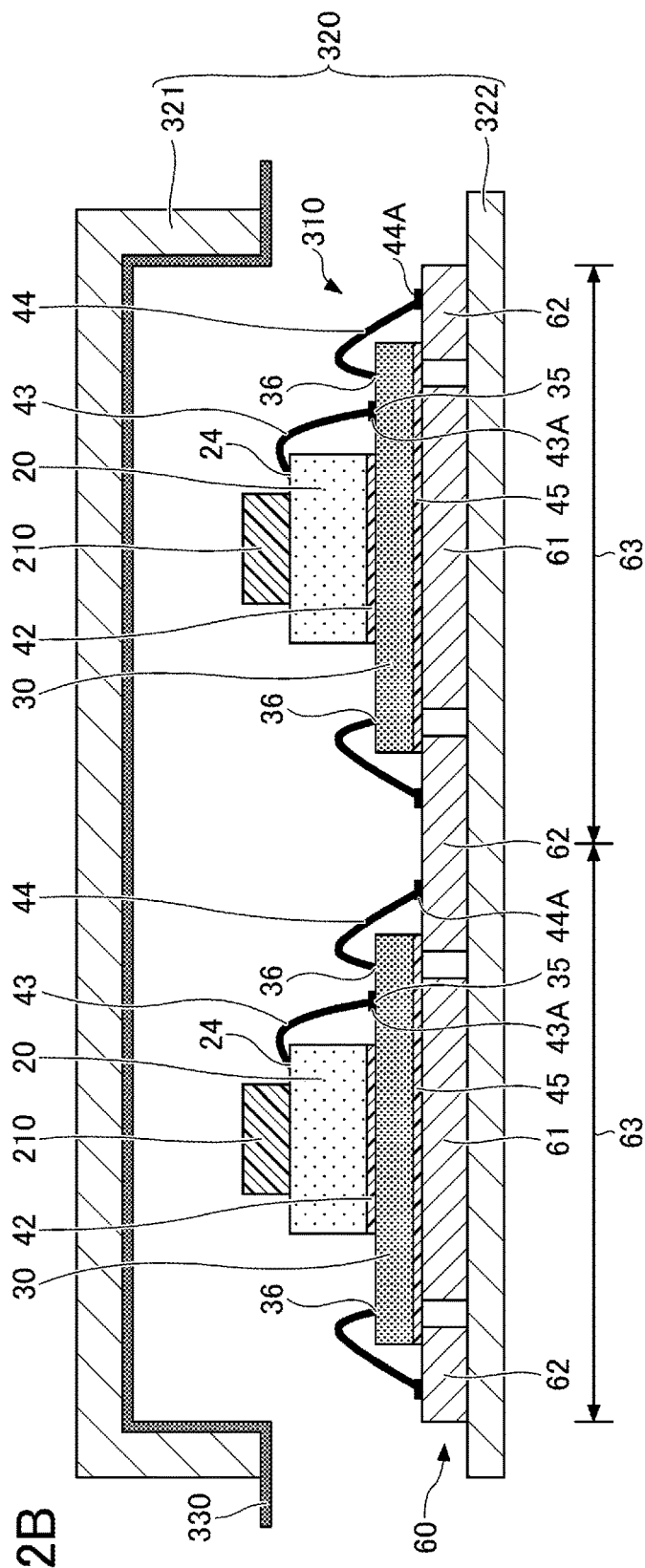

Then, as illustrated in FIG. 12B, a mold 320 consisting of an upper mold 321 and a lower mold 322 is prepared, and the target article 310 is mounted on the lower mold 322. The mold 320 is a transfer mold for resin sealing. A releasing film 330 is provided on the inner surface of the upper mold 321. The releasing film 330 has a region that covers the entire inner surface of the upper mold 321. The releasing film 330 has heat resistance that can withstand a heating temperature during resin molding. Also, the releasing film 330 has a peeling property that enables the releasing film to be easily peeled from the molding resin 40 and the mold 320. The releasing film 330 is formed by, for example, ethylene-tetrafluoroethylene (ETFE). For the releasing film 330 at a temperature of 25° C., a storage modulus is in the range of from 700 MPa through 900 MPa, and a loss modulus is in the range of from 10 MPa through 30 MPa. Also, for the releasing film 330 at a temperature of 180° C., the storage modulus is in the range of from 10 MPa through 30 MPa, and the loss modulus is in the range of from 1.0 MPa through 3.0 MPa.

Then, as illustrated in FIG. 13A, the upper mold 321 is connected to the lower mold 322 via the releasing film 330. In this case, a distance L0 between the upper surface of the lower mold 322 and the lower surface of the upper mold 321 is preset to a value corresponding to the thickness of the sensing device 10. In this case, the releasing film 330 contacts the protective layer 210, and thus the target article 310 to be molded is pressed in a thickness direction, by the upper mold 321 and the lower mold 322. As a result, the first DAF 45, the second DAF 42, and the protective layer 210, of which the elastic modulus of each is less than the elastic modulus of each of the lead frame 60, the ASIC chip 30, and the sensor chip 20, are elastically deformed in a compression direction.

With this arrangement, in a state in which the upper mold 321 and the lower mold 322 are connected to each other via the releasing film 330, while heating the mold 320, the molding resin 40 is supplied to an interior space of the mold 320 through a supply path, as expressed by the arrow 331. In such a manner, the sensor chips 20, the ASIC chips 30, the first bonding wires 43, the second bonding wires 44, and the lead frame 60 are sealed with the molding resin 40. In other words, while pressing the target article 310 in the thickness direction, resin is injected into a space within the mold 320, and the molding resin 40 is formed simultaneously for the entire chip-mounting regions 63. A heating temperature for the mold 320 may be, for example, in the range of from 160° C. through 200° C.

After the molding resin 40 is solidified, the upper mold 321 is separated from the lower mold 322, as illustrated in FIG. 13B. When the upper mold 321 is separated from the lower mold 322, pressure on the protective layer 210 is released. In contrast, even when the upper mold 321 is separated from the lower mold 322, the first DAF 45 and the second DAF 42 remain compressed because the molding resin 40 is solidified. In other words, the first DAF 45 and the second DAF 42 remain deformed elastically. Then, (i) the sensor chips 20 with the respective protective layers 210, (ii) the ASIC chips 30, (iii) the second bonding wires 43, (iv) the first bonding wires 44, and (v) the lead frame 60, which are sealed with the molding resin 40, are removed from the mold 320. Further, the releasing film 330 is peeled from the molding resin 40 and the protective layers 210.

Then, as illustrated in FIG. 14A, the protective layers 210 are removed. For example, the protective layers 210 can be removed by ashing. Openings 50 are each formed in a portion at which a corresponding protective layer 210 is removed. The opening 50 in which the humidity sensor 21 and the temperature sensor are exposed is formed for each chip-mounting region 63. Instead of ashing, solutions can be used to remove the protective layers in consideration of the material of the protective layers 210.

The molding resin 40 and the lead frame 60 are then cut, as illustrated in FIG. 14B. In other words, each of the molding resin 40 and the lead frame 60 is diced for each chip-mounting region 63.

In such a manner, a plurality of sensing devices 10 are manufactured.

In the present embodiment, the first DAF 45, the second DAF 42, and the protective layers 210 are compressed in the thickness direction, through the mold 320. Then, in such a state, resin is injected into an internal space of the mold 320 to thereby form the molding resin 40. In this process, even if the thickness for each of the lead frame 60, the ASIC chip 30, and the sensor chip 20 deviates from a design value, each of the first DAF 45, the second DAF 42, and the protective films 210 serves as a buffer, and thus the deviation (thickness offset) is reduced. With this arrangement, compressive stress acting on the ASIC chip 30 and the sensor chip 20 can be mitigated while setting the thickness of a given manufactured sensing device to a design value. Thus, even if total thickness deviation, from the design value, for the lead frame 60, the ASIC chip 30, and the sensor chip 20 is obtained, cracks in the ASIC chip 30 and the sensor chip 20, during sealing applied through transfer molding, can be mitigated.

Second Embodiment

Figure 15:
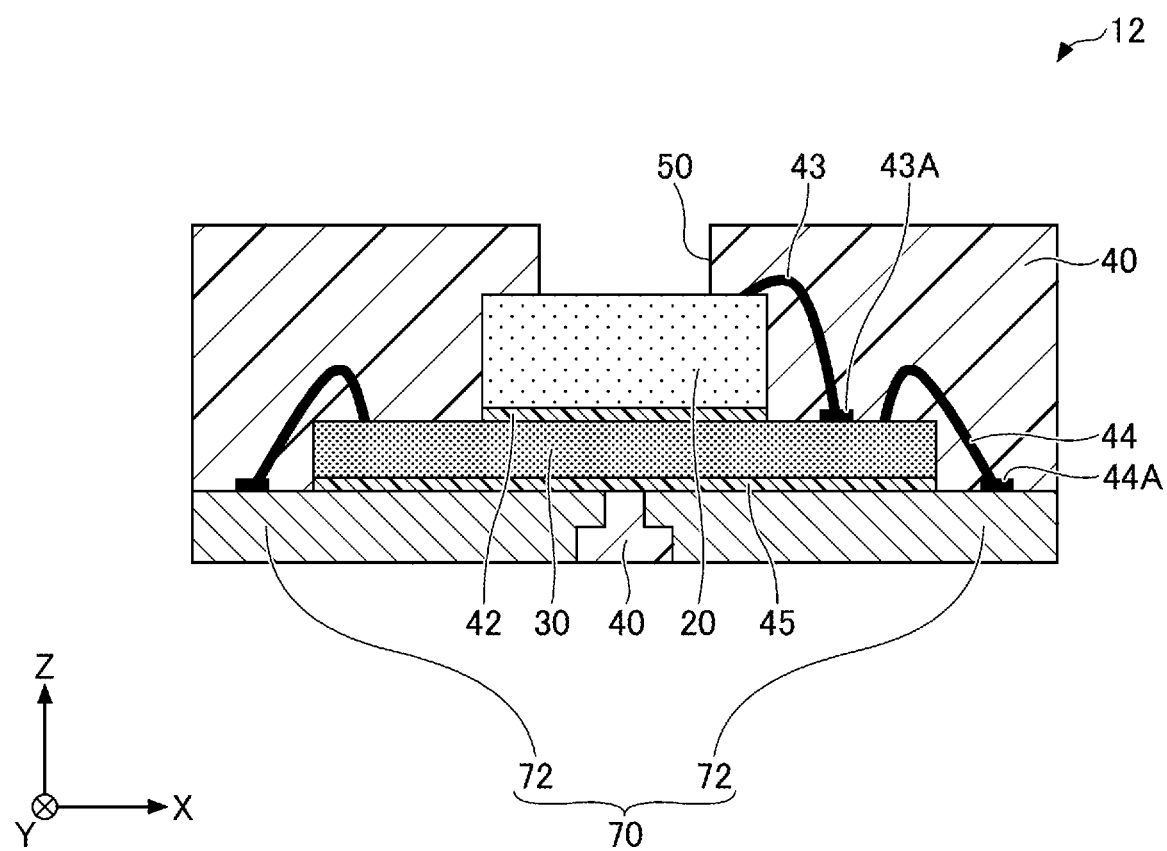
FIG. 15 is a cross-sectional view of an example of the configuration of the sensing device according to a second embodiment.

Hereafter, a second embodiment will be described. FIG. 15 is a cross-sectional view of an example of the sensing device according to the second embodiment.

A sensing device 12 according to the second embodiment includes a lead frame 70, instead of the lead frame 60. The lead frame 70 does not include any die pads, and includes a plurality of lead terminals 72. Each lead terminal 72 extends toward the inside of the sensing device 12, and is formed longer than the lead terminal 62 according to the first embodiment. A step is formed at an inner edge of each lead terminal 72, such that an upper portion of the lead terminal 72 extends inwardly from a lower portion of the lead terminal 72.

Other configurations are the same as those described in the first embodiment.

In the second embodiment, the same effect as that described in the first embodiment is obtained. Also, a great total length of an interface between the lead frame 70 and the molding resin 40, which are at the bottom surface of the sensing device 12, is obtained in comparison to a total length of an interface between the lead frame 60 and the molding resin 40 that are at the bottom surface of the sensing device 10 according to the first embodiment. With this arrangement, moisture that enters beyond the above interface can be reduced.

Third Embodiment

Figure 16:
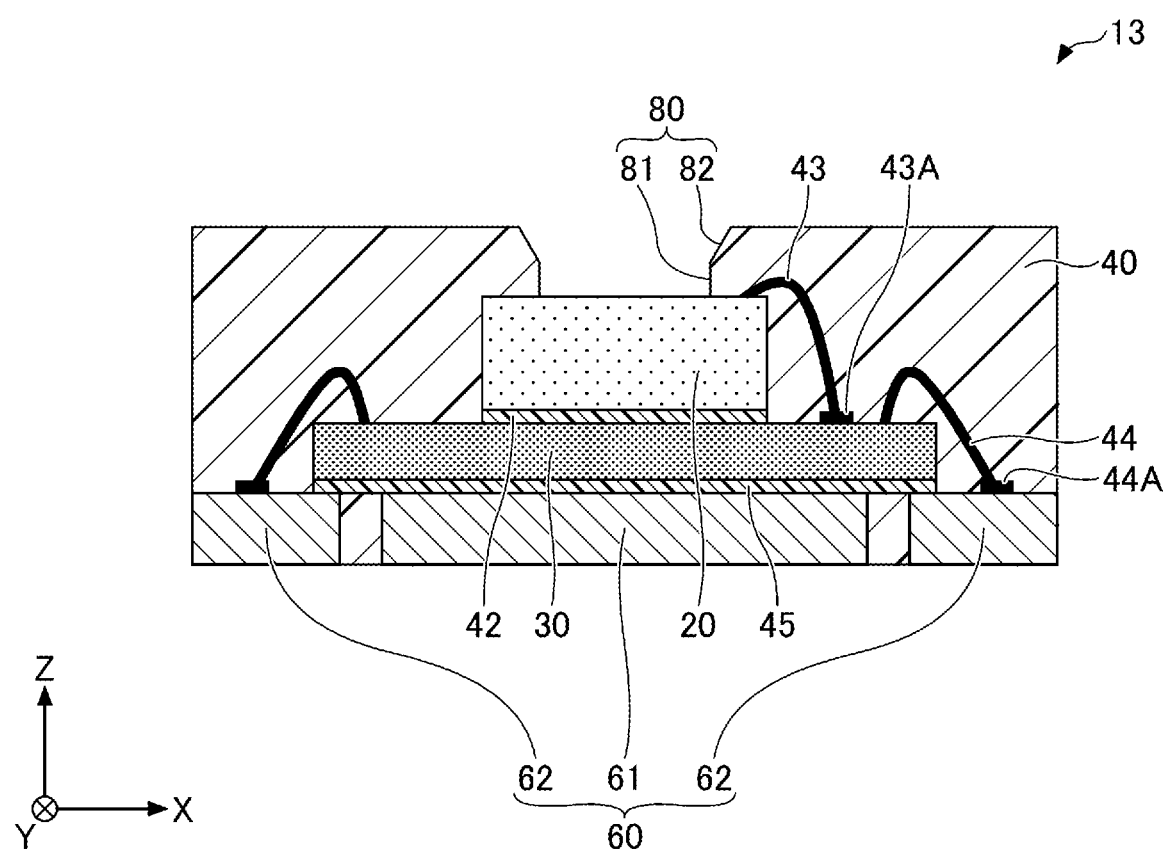
FIG. 16 is a cross-sectional view of an example of the configuration of the sensing device according to a third embodiment.

Hereafter, a third embodiment will be described. FIG. 16 is a cross-sectional view of an example of the sensing device according to the third embodiment.

In a sensing device 13 according to the third embodiment, an opening 80 is formed in the molding resin 40, instead of the opening 50. The opening 80 has (i) a first opening 81, of which a wall surface is approximately perpendicular to the top surface of the sensor chip 20, and (ii) a second opening 82 that is tapered such that the area of the second opening 82 is reduced toward the bottom. The first opening 81 is located closer to the sensor chip 20 than the second opening 82. The lower end of the first opening 81 is located at the top surface of the sensor chip 20. The lower end of the second opening 82 is continuously coupled to the upper end of the first opening 81.

Other configurations are the same as those described in the first embodiment.

In the third embodiment, the same effect as that described in the first embodiment is obtained.

The method for manufacturing the sensing device 13 will be described below. The method for manufacturing the sensing device 13 mainly differs from the method for manufacturing the sensing device 10, in (i) the process of forming the protective layer and (ii) the configuration of the upper mold 321. FIG. 17 is a cross-sectional view of an example of the sensing device 13 according to the third embodiment, and the cross-sectional view is described for the method for manufacturing the sensing device 13.

In a method for manufacturing the sensing device 13 according to the third embodiment, when the sensor chip 20 is manufactured, the protective layer is formed from only the photosensitive resist film 211, without forming the photosensitive resist film 212. In other words, in FIG. 3, step S105 in which the photosensitive film 212 is formed, as well as step S106 in which the prebake of the photosensitive resist film 212 is performed, are omitted. As a result, as illustrated in FIG. 17A, the sensor chip 20, in which the humidity sensor 21 and the temperature sensor are covered by the protective layer 213, is obtained, and the protective layer 213 is disposed lower than the protective layer 210 formed in the first embodiment.

Figure 17A:
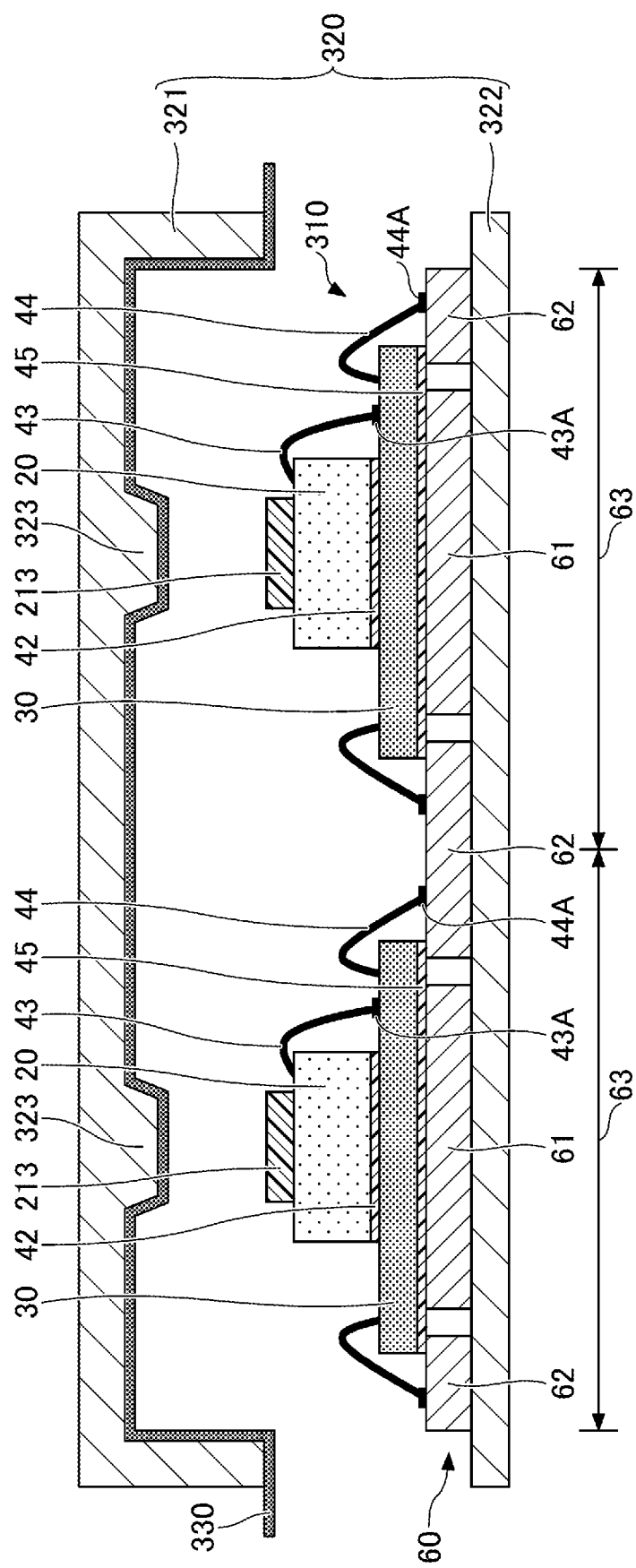
FIGS. 17A and 17B are cross-sectional views of an example of the sensing device according to the third embodiment, the cross-sectional views being described for the method for manufacturing the sensing device.
Figure 17B:
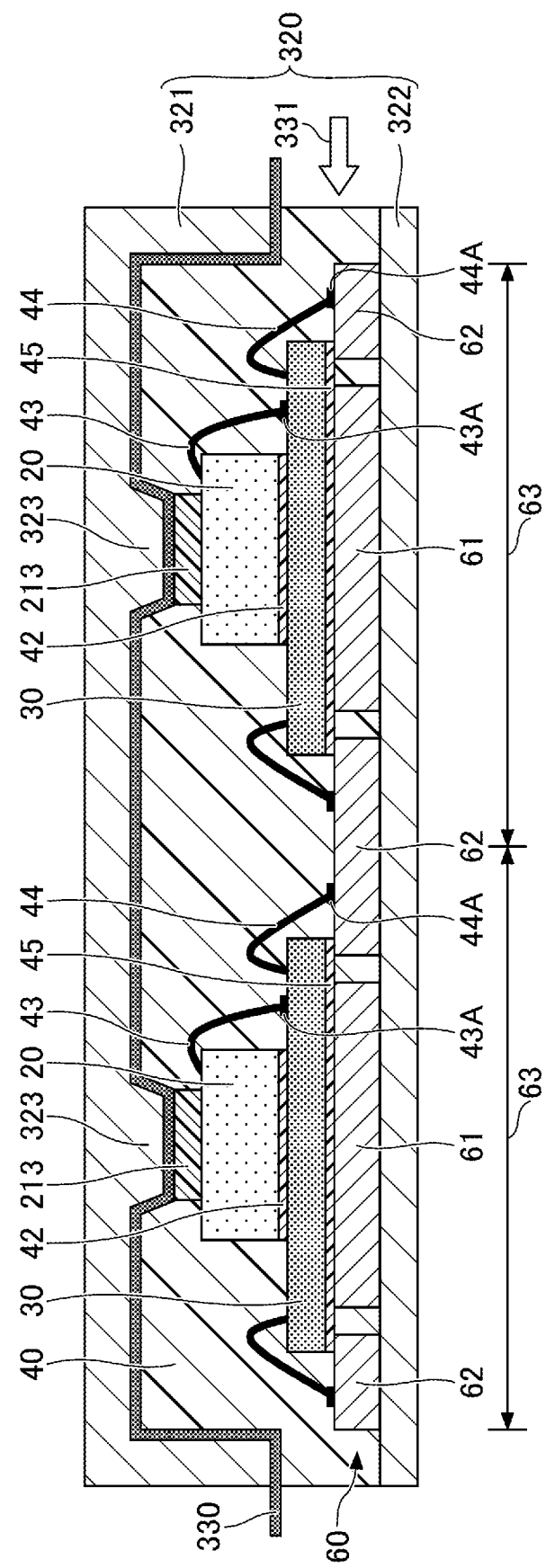

When the sensing device 13 is manufactured, the upper mold 321 with a plurality of protruding portions 323 that are respectively used to form second openings 82 for chip-mounting regions 63, as illustrated in FIG. 17A, is used. The cross-sectional shape of each protruding portion 323 is a trapezoid. Also, as in the first embodiment, as illustrated in FIG. 17B, in a state in which the upper mold 321 and the lower mold 322 are connected to each other via the releasing film 330, while heating the mold 320, the molding resin 40 is supplied to an interior space of the mold 320 through a supply path, as expressed by the arrow 331.

The process other than the process described above is performed as in the method for manufacturing the sensing device 10 according to the first embodiment.

In the third embodiment, forming of the photosensitive resist film 212, as well as the prebake of the photosensitive resist film 212, can be omitted, and thus the entire process can be simplified.

Fourth Embodiment

Figure 18:
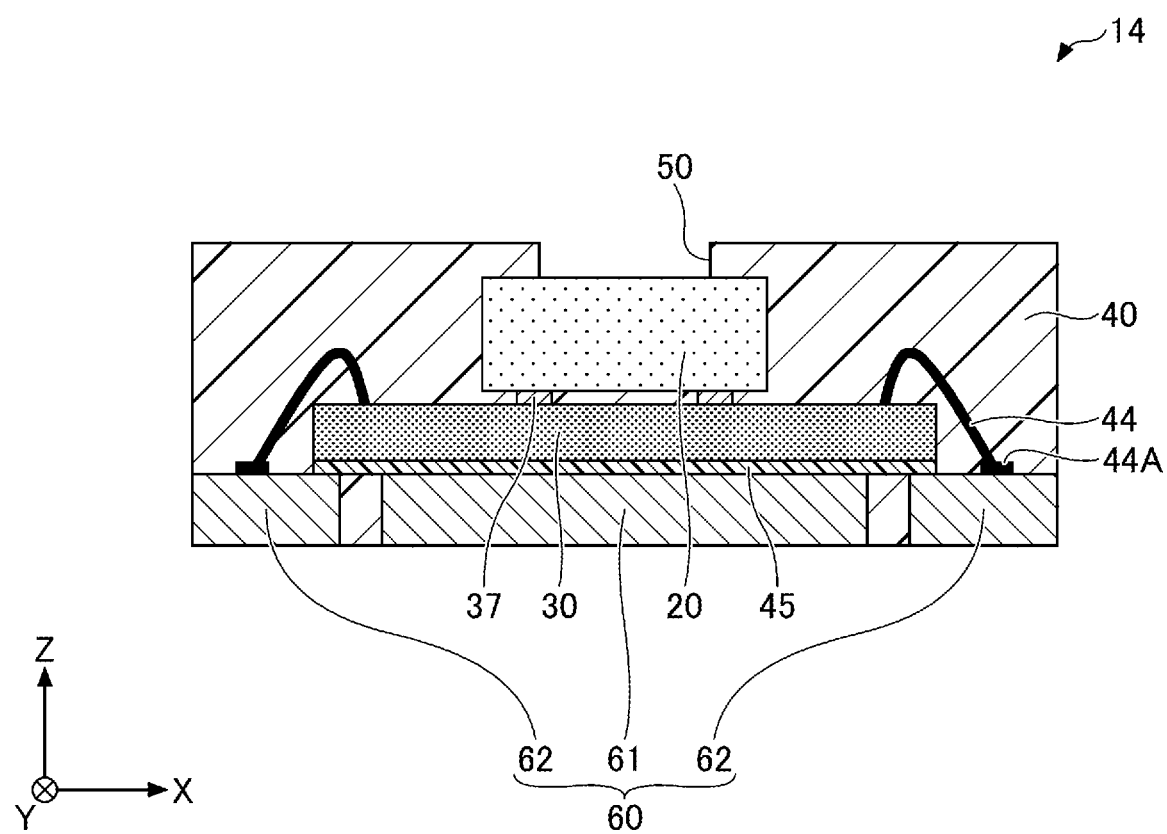
FIG. 18 is a cross-sectional view of an example of the configuration of the sensing device according to a fourth embodiment.

Hereafter, a fourth embodiment will be described. FIG. 18 is a cross-sectional view of an example of the sensing device according to the fourth embodiment.

In a sensing device 14 according to the fourth embodiment, without providing the first pad 35 on the ASIC chip 35, third pads for connection to the sensor chip 20 are provided on a region of the top surface of the ASIC chip 30 that overlaps the sensor chip 20 in a plan view. Also, without providing any pads 24 for wire bonding on the sensor chip 20, fourth pads for connection to the ASIC chip 30 are provided on the bottom surface of the sensor chip 20. The third pads are coupled to the fourth pads via connection members 37 such as gold bumps or solder bumps, respectively.

The thickness of an upper surface of the molding resin 40 relative to the top surface of the sensor chip 20 is about half the thickness described in the first embodiment. For example, the thickness of the upper portion of the molding resin 40 relative to the top surface of the sensor chip 20 is approximately the same as a depth of the first opening 81 described in the first embodiment.

Other configurations are the same as those described in the first embodiment.

In the fourth embodiment, the same effect as that described in the first embodiment is obtained. Also, the second bonding wires 43 are not used, and thus the sensing device 13 can be made thinner than the sensing device 10.

A method for manufacturing the sensing device 14 will be described below. The method for manufacturing the sensing device 14 mainly differs from the method for manufacturing the sensing device 10 in (i) the process of mounting the sensor chip 20, (ii) the process of forming the protective layer, and (iii) a given distance between the upper surface of the lower mold 322 and the lower surface of the upper mold 321. FIG. 19 is a cross-sectional view of an example of the sensing device 14 according to the fourth embodiment, and the cross-sectional view is described for the method for manufacturing the sensing device 14.

Figure 19A:
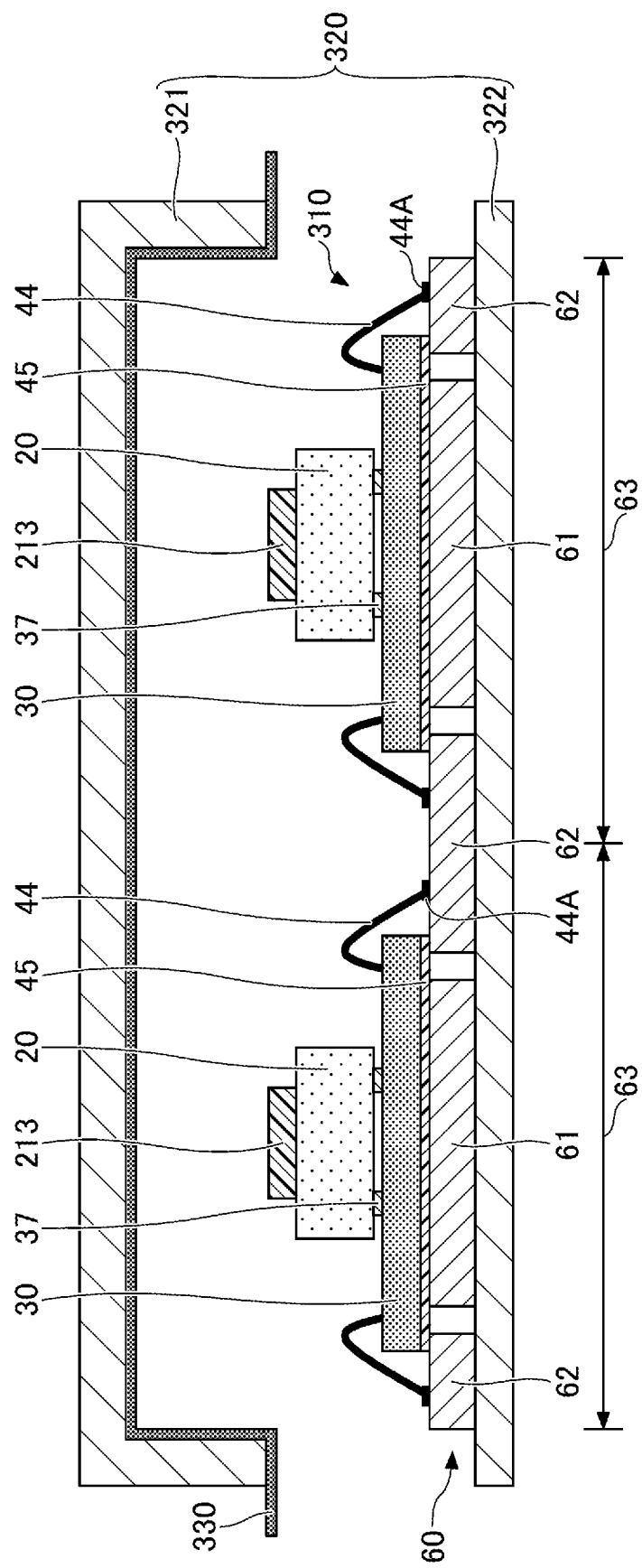
FIGS. 19A and 19B are cross-sectional views of an example of the sensing device according to the fourth embodiment, the cross-sectional views being described for the method for manufacturing the sensing device.

As in the third embodiment, in the method for manufacturing the sensing device 14 according to the fourth embodiment, when the sensor chip 20 is manufactured, each protective layer is formed from only the photosensitive resist film 211, without forming the photosensitive resist film 212. In other words, in FIG. 3, step S105 in which the photosensitive resist film 212 is formed, and step S106 in which the prebake of the photosensitive resist film 212 is performed, are omitted. As a result, as illustrated in FIG. 19A, each sensor chip 20, in which the humidity sensor 21 and the temperature sensor are covered by the protective layer 213, is obtained, and the protective layer 213 is disposed lower than the protective layer 210 formed in the first embodiment.

Also, without using the second DAF 42, each connection member 37, such as solder, is provided between the third pad on the ASIC chip 30 and the fourth pad on the sensor chip 20, and then flip-chip mounting of the sensor chip 20 is performed on the ASIC chip 30. In this case, connection between the chips is not performed using one or more second bonding wires 43.

Figure 19B:
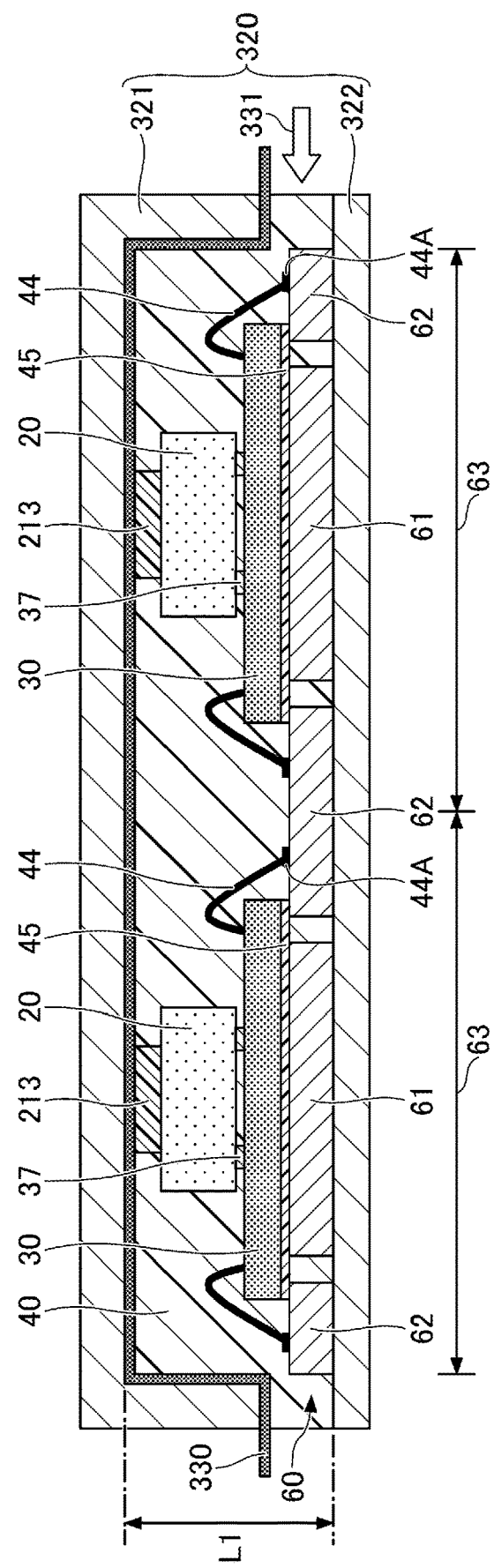

Further, as illustrated in FIG. 19B, the lower surface of the upper mold 321 is flat. When the upper mold 321 is coupled to the lower mold 322 via the releasing film 330, a short distance L1 between the upper surface of the lower mold 322 and the lower surface of the upper mold 321 is obtained in comparison to the distance L0 described in the first embodiment. For example, in comparison to the distance L0, a short distance L1 is obtained by a difference in the height between the protective layer 210 and the protective layer 213.

The process other than the process described above is performed as in the method for manufacturing the sensing device 10 according to the first embodiment.

In the fourth embodiment, forming of the photosensitive resist film 212, as well as the prebake, can be omitted, and thus the entire process can be simplified.

For example, the material of the photosensitive resist films 211 and 212 includes a novolac-based resin, an acrylic-based resin, or a polyimide-based resin. In this case, the material of the protective layer 210 includes, for example, a novolac resin, an acrylic resin, or a polyimide resin. Instead of spin coating of the liquid resist, a film-like resist may be applied.

The planar shape of each of the protective layers 210 and 213 is not limited to a rectangle, and may include a polygon other than the rectangle, a circle, an ellipse, or the like.

The material of each of the protective layers 210 and 213 is not limited to the photosensitive resist. For example, the material of each of the protective layers 210 and 213 may be a non-photosensitive material such as cellulose. For example, acetone is used as a solvent for cellulose, an acetone solution for cellulose is applied through spin coating, and then the acetone is removed by baking. The coating and baking are repeated to form a cellulose film having a desired thickness. Subsequently, a typical novolac-based photosensitive resist or the like is applied, and then exposing and developing are performed. In this process, a resist mask is formed to cover a region in which the protective layers 210 and 213 are to be formed and to expose the other region. An exposed portion of the resist mask, as the cellulose film, is then removed by using acetone or by reactive ion etching (RIE). Then, the resist mask is removed using butyl acetate. In such a process, the protective layers 210 and 213 from a non-photosensitive film can be formed.

Although the preferred embodiments have been described, various modifications and substitutions can be made to the embodiments without departing from the scope defined in the present disclosure.

What is claimed is:

1. A method for manufacturing a sensing device, the method comprising:
    providing a semiconductor integrated circuit chip over a lead frame via a first insulating film, the lead frame including an external derivation lead;
    providing a sensor chip, on which a protective layer is formed, over the semiconductor integrated circuit chip, the sensor chip having a first surface and a second surface opposite to the first surface, a sensor being provided on the second surface of the sensor chip, the protective layer covering the sensor, and the first surface of the sensor chip facing the semiconductor integrated circuit chip;
    electrically coupling the external derivation lead to the semiconductor integrated circuit chip via a first bonding wire;
    electrically coupling the semiconductor integrated circuit chip to the sensor chip via a second bonding wire;
    injecting resin into a space in a mold while pressing the protective layer by the mold, thereby forming a molding resin with which the lead frame, the semiconductor integrated circuit chip, the sensor chip, the first bonding wire, and the second bonding wire are sealed; and
    removing, after the forming of the molding resin, the protective layer, thereby forming an opening having a sidewall in the molding resin, the sensor being exposed through the sidewall of the opening,
    wherein the protective layer has a thickness that exceeds a height at which the second bonding wire extends.

2. A method for manufacturing a sensing device, the method comprising:
    providing a lead frame including a plurality of chip-mounting regions, the lead frame including an external derivation lead for each chip-mounting region;
    providing a semiconductor integrated circuit chip over the lead frame via a first insulating film, for each chip-mounting region;
    providing, for each chip-mounting region, a sensor chip, on which a protective layer is formed, over the semiconductor integrated circuit chip, the sensor chip having a first surface and a second surface opposite to the first surface, a sensor being provided on the second surface of the sensor chip, the protective layer covering the sensor, and the first surface of the sensor chip facing the semiconductor integrated circuit chip;
    for each chip-mounting region,
        electrically coupling the external derivation lead to the semiconductor integrated circuit chip via a first bonding wire, and electrically coupling the semiconductor integrated circuit chip to the sensor chip via a second bonding wire;
    simultaneously injecting, for the entire chip-molding regions, resin into a space in a mold while pressing protective layers by the mold, thereby forming a molding resin with which the lead frame, semiconductor integrated circuit chips, sensor chips, first bonding wires, and second bonding wires are sealed;
    after the forming of the molding resin, removing, for each chip-mounting region, the protective layer, thereby forming an opening having a sidewall in the molding resin, the sensor being exposed through the sidewall of the opening; and
    after the forming of the opening, dicing the lead frame and the molding resin, for each chip-mounting region,
    wherein the protective layer has a thickness that exceeds a height at which the second bonding wire extends.

3. The method according to claim 1, wherein an elastic modulus of the protective layer is less than an elastic modulus of each of the semiconductor integrated circuit chip and the sensor chip.

4. The method according to claim 1, wherein in the providing of the semiconductor integrated circuit chip, the semiconductor integrated circuit chip is provided over at least a portion that includes the external derivation lead, via the first insulating film.

5. The method according to claim 4, wherein the lead frame includes a die pad, and the semiconductor integrated circuit chip is provided over the external derivation lead and the die pad, via the first insulating film.

6. The method according to claim 1,
    wherein after the providing of the sensor chip and prior to the forming of the molding resin, for each chip-mounting region, the coupling of the semiconductor integrated circuit chip to the sensor chip via the second bonding wire is performed, the sensor chip being provided over the semiconductor integrated circuit chip via a second insulating film, and the second bonding wire being sealed with the molding resin.

7. The method according to claim 6, wherein an elastic modulus of the second insulating film is less than an elastic modulus of each of the semiconductor integrated circuit chip and the sensor chip.

8. The method according to claim 1, wherein an elastic modulus of the first insulating film is less than an elastic modulus of each of the semiconductor integrated circuit chip and the sensor chip.

9. The method according to claim 1, wherein upon occurrence of a condition in which the mold presses the protective layer, the first insulating layer and the protective layer serve as buffer materials that absorb a deviation from an expected thickness of at least one among the lead frame, the semiconductor integrated circuit chip, and the sensor chip.

* * * * *